(12) United States Patent
Wittmer et al.

(10) Patent No.: US 7,524,413 B2
(45) Date of Patent: Apr. 28, 2009

(54) METHOD AND APPARATUS FOR TREATING FLUIDS

(75) Inventors: Kenneth E. Wittmer, Newtown, CT (US); Walter F. J. Crewson, Ridgefield, CT (US); John W. Lane, Finksburg, MD (US)

(73) Assignee: Clearwater Systems Corporation, Essex, CT (US)

( * ) Notice: Subject to any disclaimer, the term of this patent is extended or adjusted under 35 U.S.C. 154(b) by 329 days.

(21) Appl. No.: 11/304,348

(22) Filed: Dec. 15, 2005
(Under 37 CFR 1.47)

(65) Prior Publication Data
US 2007/0051685 A1    Mar. 8, 2007

Related U.S. Application Data

(63) Continuation-in-part of application No. 11/192,452, filed on Jul. 27, 2005.

(60) Provisional application No. 60/634,959, filed on Dec. 10, 2004.

(51) Int. Cl.
*B01D 17/12* (2006.01)
*C02F 1/48* (2006.01)

(52) U.S. Cl. ............... 210/143; 210/222; 210/243; 204/660; 204/661

(58) Field of Classification Search ............... 210/143, 210/222, 243, 748; 204/554, 555, 660, 661
See application file for complete search history.

(56) References Cited

U.S. PATENT DOCUMENTS 5,702,600 A * 12/1997 Pandolfo .............. 210/222

6,063,267 A * 5/2000 Crewson et al. ........... 210/222

OTHER PUBLICATIONS

Clearwater Systems LLC website, "Chemical-Free Treatment of Recirculating Water Using Pulsed-Power".
Goldsworthy et al., "Biological Effects of Physically Conditioned Water", Biology Dept., Imperial College of Science Technology and Medicine, vol. 33, No. 7, pp. 1618-1626, 1999.

(Continued)

*Primary Examiner*—David A Reifsnyder
(74) *Attorney, Agent, or Firm*—Michaud-Duffy Group LLP

(57) ABSTRACT

A method and apparatus for treating a fluid to destroy, remove, or reduce undesirable agents, such as microorganisms, particles or ions, contained in the fluid and/or to inhibit the formation of scale are disclosed.

The invention includes an apparatus for treating a fluid to destroy, remove, or reduce undesirable agents, such as microorganisms, particles, or ions, contained in the fluid and/or to inhibit the formation of scale. The apparatus can include an open fluid directional means or conduit. The preferred open fluid directional means is a conduit manufactured of resilient, corrosion-resistant material. The apparatus is attached to a power source and has a controller means. The controller means is desirably a microprocessor and can include a switching means for regulating the current to the apparatus. However, simpler circuits and components can be used for the controller means. The apparatus includes a field generating means. The field generating means forms a treatment field. The treatment field is a magnetic field and/or an electrical field in an effective dose sufficient to treat the fluid. The effective dose is determined by the exposure time(s) and strength(s) of the treatment field(s) and the concentration of contaminants present in the fluid subjected to the treatment.

10 Claims, 36 Drawing Sheets

OTHER PUBLICATIONS

Baker et al., "Magnetic Amelioration of Scale Formation", School of Water Sciences, Cranfield University, vol. 30, No. 2, pp. 247-260, 1996.

Donaldson et al., "Lifting the Scales from our Pipes", New Scientist 18, Feb. 1988.

Lane, John et al., "Condenser Water Treatment Using Pulsed Power," 2003 Cooling Technology Institute Annual Conference, San Antonio, TX.

* cited by examiner

| NOMINAL PIPE SIZE | COILS L₁ & L₃ | COILS L₂-INNER & L₂-OUTER | TUNING CAPACITOR $C_T$ | NOMINAL POWER SUPPLY VOLTAGE (UNDER LOAD) |
|---|---|---|---|---|
| 3/4" | TURNS 375<br>WIRE 20 GA.<br>LENGTH 1.9" | TURNS 250<br>WIRE 20 GA.<br>LENGTH 1.9" | 0.039µf | 11.0V(RMS) |
| 1" | TURNS 375<br>WIRE 18 GA.<br>LENGTH 2.3" | TURNS 250<br>WIRE 18 GA.<br>LENGTH 2.3" | 0.010µf | 13.0V(RMS) |
| 2" | TURNS 375<br>WIRE 17 GA.<br>LENGTH 3.7" | TURNS 250<br>WIRE 17 GA.<br>LENGTH 3.7" | 0 | 19.0V(RMS) |
| 4" | TURNS 375<br>WIRE 16 GA.<br>LENGTH 3.55" | TURNS 250<br>WIRE 16 GA.<br>LENGTH 3.55" | 0 | 33.0V(RMS) |
| 6" | TURNS 375<br>WIRE 12 GA.<br>LENGTH 5.18" | TURNS 250<br>WIRE 12 GA.<br>LENGTH 5.18" | 0 | 37.0V(RMS) |
| 8" | TURNS 146<br>WIRE 8 GA.<br>LENGTH 8.5" | TURNS 146<br>WIRE 8 GA.<br>LENGTH 8.5" | 0 | 37.0V(RMS) |

FIG. 10

METHOD AND APPARATUS FOR TREATING FLUIDS

RELATED APPLICATIONS

This application is a continuation-in-part of U.S. application Ser. No. 11/192,452, filed on Jul. 27, 2005, and is entitled to the benefit of and incorporates by reference essential subject matter disclosed in U.S. Provisional Patent Application No. 60/634,959, filed on Dec. 10, 2004.

BACKGROUND OF THE INVENTION

1. Field of the Invention

This invention relates generally to the treatment of flowing water or other liquids, and more particularly to the treatment of such liquids with a ringing electromagnetic pulse.

2. Description of the Background Art

Various different devices and methods have been proposed for treating liquids with electromagnetic flux for the purpose of reducing the scaling propensity of the liquids, for reducing the number of living microorganisms contained in the liquids, or for other purposes. Some of these prior devices have used either stationary or movable permanent magnets for producing a magnetic flux. Other devices have used electrical coils arranged in various different ways with respect to pipes conducting the liquid wherein the coils are energized by either a direct current power source or an alternating current power source to create an electromagnetic flux used as the liquid treatment factor.

U.S. Pat. No. 5,702,600 to Pandolfo discloses a variable resonance descaling decalcifier device connected to a forced sequential rephasing transformer. The device of this patent uses an apparatus including a plurality of electrical coils surrounding different separate longitudinal sections of a liquid conducting pipe to provide an electromagnetic flux for the treatment of water. In the apparatus, two of the coils are wound on top of one another, and an ordinary diode is connected in circuit with the coils and with the power source, such that current from the power source is conducted through the coils only during alternate half-cycles of one voltage polarity wherein some current of a ringing nature apparently flows through each coil following the end of each half-cycle of diode conduction. However, the ringing current, and the electromagnetic flux produced appears to be weak and of very short duration so as to be of small effectiveness.

U.S. Pat. No. 6,063,267 to Crewson et al., the disclosure of which is herein incorporated by reference, discloses an apparatus for treating flowing liquid with electromagnetic flux. The apparatus of this patent treats flowing liquid with electromagnetic flux. The commercial embodiment of the device is sold under the trade name "Dolphin." The Crewson et al. apparatus creates or applies magnetic fields of a repetitive nature in a flowing fluid. Such magnetic fields are the natural response of an induction coil or coils to an abrupt cessation, or other abrupt change, of the flow of current through the coil or coils. This phenomenon is known as "ringing."

The precipitation of calcium carbonate as powder rather than scale and the control of biological activity are directly ascribed to the existence of these electrical and magnetic fields. Powder precipitation has been ascribed to a reduction or elimination of the surface charge, that is normally present on colloidal particles, by the time varying electric and magnetic fields. The reduction in surface charges substantially reduces or eliminates the electrostatic repulsion between these particles, which, in turn, increases collisions between particles resulting in rapid particle growth and settling (as opposed to scaling on heat transfer surfaces). The control of biological activity has been ascribed to encapsulation of bacteria in the precipitating calcium powder, as previously described, and to a direct interaction between the cell membrane and the electric and magnetic fields. Bacterial cell membranes are known to act as electrical capacitors as by carrying a layer of electric charge. When stimulated by electric and/or magnetic fields at the proper frequency, significant disruptions in the functions of the membranes as by disturbing the charge layers surrounding cells, are known to occur. When power levels are sufficiently high, cell membranes are known to rupture by a process called electroporation.

SUMMARY OF THE INVENTION

The invention includes an apparatus for treating a fluid to destroy, remove, or reduce undesirable agents, such as microorganisms, particles, or ions, contained in the fluid and/or to inhibit the formation of scale. The apparatus can include an open fluid directional means or conduit. The preferred open fluid directional means is a conduit manufactured of resilient, corrosion-resistant material. The apparatus is attached to a power source and has a controller means. The controller means is desirably a microprocessor and can include a switching means for regulating the current to the apparatus. However, simpler circuits and components can be used for the controller means. The apparatus includes a field generating means. The field generating means forms a treatment field. The treatment field is a magnetic field and/or an electrical field in an effective dose sufficient to treat the fluid. The effective dose is determined by the exposure time(s) and strength(s) of the treatment field(s) and the concentration of contaminants present in the fluid subjected to the treatment.

The preferred embodiment of the apparatus includes a magnetic field means. The magnetic field means establishes an effective magnetic field within the fluid to be treated. The magnetic field means can be created by one or more electric coils. Where two coils are used, their magnetic fields can be axially opposing or "bucking" with one another. Desirably, an axial gap exists between two or more of the coils having an axial width to provide a magnetic field and, secondarily, an electric field, which differ in strength and direction from the fields within the coils and thereby enhances the treatment of the fluid.

An alternative embodiment of the apparatus includes a charging means. The charging means desirably includes at least two charge carrying bodies or electrodes. Desirably, the charge carrying bodies are spaced from one another by an effective distance or gap. The charge carrying bodies are desirably located in or very close to the fluid. An effective acyclicly varying potential difference is imposed on the charge carrying bodies via the controller means.

The apparatus can include both the magnetic field means and the charging means. The controller means can function to operate either the magnetic field means or the charging means alone or together to treat effectively the fluid.

The invention includes a method for treating a fluid. The method includes the step of passing and/or pooling fluid within a treatment zone. The next step includes applying an effective amount of treatment field from a field generating means to the fluid. The effective amount of treatment field is desirably a magnetic field and/or an electrical field. Alternatively, the method includes a step of forming a colloide with the effective amount of treatment field, which is desirably a magnetic field and/or an electrical field. The effective amount or dose of treatment field can be applied by varying the time of application or exposure of the treatment field to a volume of fluid and/or the strength of the treatment field within the treatment zone.

BRIEF DESCRIPTION OF THE DRAWINGS

The invention is described in more detail by reference to the accompanying drawings.

FIG. 10 is a chart specifying preferred values of certain parameters of the apparatus of FIGS. 1 to 6.

DETAILED DESCRIPTION OF THE PREFERRED EMBODIMENTS

Figure 1:
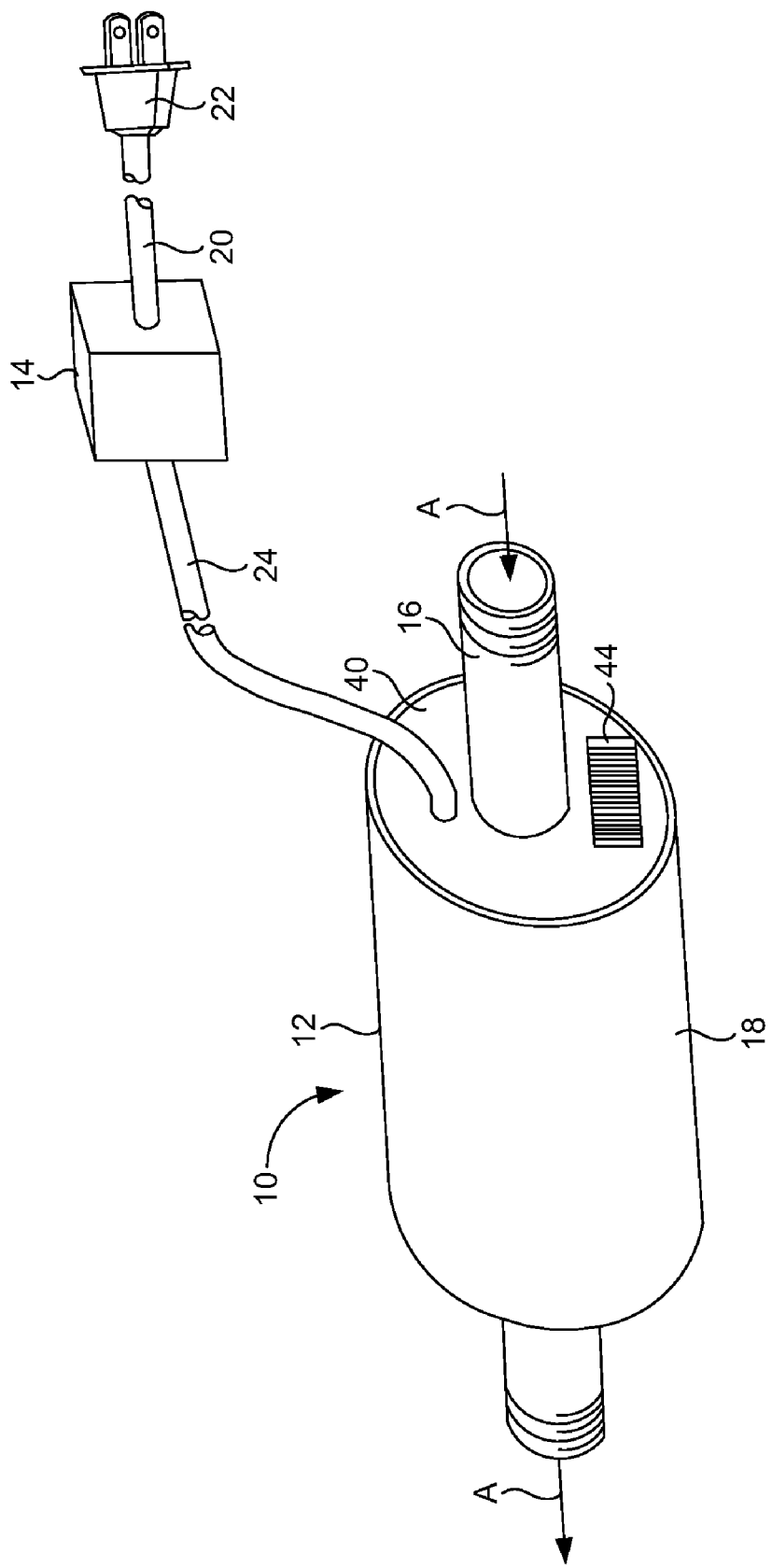
FIG. 1 is perspective view of an apparatus containing the invention.

The invention includes an apparatus for treating a fluid to destroy, remove, or reduce undesirable agents, such as microorganisms, particles, or ions, contained in the fluid and/or to inhibit the formation of scale. The apparatus can include an open fluid directional means or conduit. The apparatus is attached to a power source and has a controller means. The controller means is desirably a microprocessor and includes a switching means for regulating the current to the apparatus. However, simpler circuits and components can be used for the controller means. The apparatus includes a field generating means. The field generating means forms a treatment field. The treatment field is a magnetic field and/or an electrical field in an effective dose sufficient to treat the fluid. The effective dose is determined by the exposure time(s) and strength(s) of the treatment field(s) and the concentration of contaminants present in the fluid subjected to the treatment. The apparatus can include both the magnetic field means and the charging means. The controller means can function to operate either the magnetic field means or the charging means alone or together to treat effectively the fluid.

The invention includes a method for treating a fluid. The method includes the step of passing and/or pooling fluid within a treatment zone. The next step includes applying an effective amount of treatment field from a field generating means to the fluid. The effective amount of treatment field is desirably a magnetic field and/or an electrical field. The effective amount or dose of treatment field can be applied by varying the time of application or exposure of the treatment field to a volume of fluid and/or the strength of the treatment field within the treatment zone.

An open fluid directional means or conduit is used in preferred embodiments of the invention. The preferred open fluid directional means is a conduit manufactured of resilient, corrosion-resistant material. The open fluid directional means can direct flowing fluid and/or permit the fluid to pool in a treatment zone. A convenient and inexpensive open fluid directional means is a conduit or pipe made from PVC or similar plastic material. The conduit can be of a sufficient length and diameter to form a treatment zone sufficient to permit a measured stream of fluid to pass through the treatment zone in accordance with the magnetic field and/or electrical field applied to the fluid. The measured stream is calculated by the volume and rate of flow of the fluid through the conduit as well as the estimated contaminant level of the fluid.

The controller means for an embodiment of the invention that applies a magnetic field to the treatment zone can include components or means for generating a relatively low alternating voltage signal, for example, in the range of 11 to 37 volts and 50 to 60 Hz, and means for interrupting that signal rapidly and repeatedly, such as, to switch the signal on and off.

The invention can include one or more of four independent components. Two of these components are related to gaps or longitudinal spaces between induction coils. The third component is related to the use of auxiliary electrodes. The fourth component is related to a method and a means for generating high frequency signals.

The first gap-related component of this invention requires at least two induction coils to be placed around a section of conduit or pipe. This component also requires that these coils be wound and powered so that the current flowing through each coil generates an axial magnetic field within the coil and that the direction of the two fields are opposing. Coils so arranged and powered provide a means for generating opposing magnetic fields and are called "bucking coils." This component further requires that an axial gap exist between the two coils. When the coils are arranged and powered as described, an axial magnetic field exists within the confines of each coil. A radial magnetic field exists between the coils. Near the boundaries of the two coils the magnetic field varies in direction with both axial and radial position. In addition to the variation in field direction associated with the gap between bucking coils, the magnetic field strength can be expected to increase significantly in this region. The degree of strengthening of the field depends on a variety of parameters including the geometry of the gap, pipe diameter, and gap length.

Due to the time varying nature of the magnetic fields described above, electric fields are generated by induction. The electric fields so generated are oriented at right angles to the magnetic field from which they were created. In this condition, the electric fields are directed circumferentially within each coil and in the gap between coils. While the field direction is in all cases circumferential, the exact direction (e.g., clockwise or counterclockwise) and the plane of electromagnetic vibrations change with location. Equipotential surfaces, which are oriented perpendicularly to the direction of the electric field, vary with position from circumferential within the coil to radial within the gap.

The gap between bucking coils subjects a particle of water, which is flowing in the treatment zone as well as associated ions, colloidal and larger particles, and microbiological life forms, to electric and magnetic fields of increased strength and varying direction and potential. The fluid treatment by the device relies on removal of charges from colloidal particles and the subsequent collision between these particles. The increased field strengths and variations in direction and potential with position in the treatment zone enhances the frequency of collisions of these particles and increases the effectiveness of the treatment process.

The second gap-related component also requires at least two induction coils to be placed around a section of pipe. These coils are powered so that a potential difference exists between adjacent surfaces on the coils. These coils can be wound so that the resulting magnetic fields are bucking, as previously described, or have similarly directed magnetic fields. This component further requires that an axial gap exist between the two coils. The existence of a potential difference between the two adjacent coil surfaces indicates that an electric field exists between these surfaces and that it will be directed from the surface of greater potential to the surface of lesser potential. The field strength depends on the potential between the surfaces and the separation distance. Higher field strengths are possible with small gaps as compared to large gaps. However, due to the fact that the coils are located outside of the conduit or pipe, most of the electric field so created does not interact with the fluid or water flowing through the pipe. As the distance between the coils increases, the field strength decreases but the fringing effects at the edge of the field increase. The result is that with larger gap sizes, the fringes of the field, albeit at a lower strength, extend inside the pipe where they can interact with the flowing water.

Due to the time-varying nature of the electric fields described above, magnetic fields are generated by induction. The magnetic fields so generated are oriented at right angles to the electric field from which they were created. In the present case, the electric fields are directed circumferentially.

Electric and magnetic fields generated by the potential difference between adjacent coils are significantly stronger than those of previous devices (see Table 1) and have a significantly greater effect on particle surface charges, particle collisions, and biological activity through assaults on the integrity of cell membranes.

The third component that can be used with the invention has auxiliary electrodes. These electrodes are made of metal foils, plates, or wires placed around the outside of the conduit or pipe. Power can be supplied to the electrodes from either the induction coils or from a separate signal generator. Connections are made to the electrodes such that a potential difference and, therefore, an electric field exist between pairs of electrodes. Electrodes can be configured so that gaps over which potential differences exist are oriented axially, circumferentially, or as a combination of the two. In all instances, circumferentially spaced gaps, which may or may not be associated with potential differences, must exist to prevent the circumferential movement of charges as a result of electric and magnetic fields caused by the induction coils.

Depending on the electrode configuration, electric fields generated by the electrodes can be axial or, at least in the vicinity of the inner pipe wall, radial, or some combination of the two. Also depending on configuration, the electric field strength can be significantly higher than the electric field strengths of previous devices (Table 1).

Due to the time varying nature of the electric fields described above, magnetic fields are generated by induction. The magnetic fields so generated are oriented at right angles to the electric field from which they were created. The orientation of these fields relative to the pipe depends on the precise configuration of the electrodes.

The function of this component produces a potential difference between the adjacent faces of the coils and subjects fluid and associated particles, ions, and microbes to significant electric and magnetic fields. Auxiliary electrodes offer several significant advantages when compared with the axial electric fields resulting from potential differences between adjacent surfaces of the coils. These advantages are that the electrodes can be used in addition to coils for additional effect, the electrodes can be oriented to produce a wide variety of field directions, and the electrodes can be configured so that electric fields of relatively high strength penetrate the entire diameter of the pipe or treatment zone. This condition is contrasted to other electric fields that have maximum strength only near the surface of the pipe. This component provides a significant advantage in that a greater volume of water is treated with each pass through the device.

The fourth component for use with the invention is a means for generating a signal other than the signal of the induction coils to power the electrodes and optionally the coils. This means for generating a signal relates to Equation 3. Equation 3 reveals that the electric field strength in the water is proportional to both signal frequency and amplitude. Increasing either by a factor of 10 increases the field strength by a factor of 10. While there are practical limits to increasing the signal frequency and amplitude using the ringing characteristics of the coil, doing so with a signal generator can be readily accomplished. This component of the invention is primarily directed toward supplying a signal for the electrodes, but little power is required for this purpose. Therefore, a signal generator can include the proper characteristics and capacity to power both the electrodes and the coils.

The embodiment of this invention for applying a magnetic field to the treatment zone desirably includes a conduit or pipe coil assembly having a section of electrically non-conducting pipe, the material, geometry, and dimensions of which can vary. One or more induction coils are placed circumferentially around the pipe. These coils can be coupled with one or more supplemental capacitors or like means. The coils and the associated capacitance, including the inherent capacitance of the coils, are desirably sized so that when a 50 to 60 cycle signal is interrupted by the components located in the controller means, a high voltage (up to 300 volts), high frequency (10 kHz to 50 kHz) decaying signal is generated. This signal and its decay rate are the natural responses to the inductive characteristics of the coils(s) and to the characteristics of the capacitance associated with the coil(s). Signal generation in this manner is commonly known as "ringing" the coil or coils.

As described by Ampere's law:

$$\oint B \cdot dl = \mu_o i \quad (1)$$

where:
B is the magnetic field strength
dl is a differential length
$\mu_o$ is the permeability constant
i is the current The passage of current through a wire creates a magnetic field in a circumferential direction around the wire through which the current passes. Where the current is being carried in a coil, the resulting magnetic field is directed axially along the pipe in either the plus or minus direction (depending on the direction of the current). Given that the current in the wire varies with time, so does the resulting magnetic field.

As described by Faraday's law:

$$\oint E \cdot dl = -\frac{d\Phi_B}{dt} \quad (2)$$

where:
E is the electric field
dl is a differential length
$d\Phi_B/dt$ is the rate of change of the magnetic flux A time varying magnetic field, as is created by both the 50 to 60 Hz and the ringing currents in the device's coil, creates an electric field that is oriented at right angles to the magnetic field. Ignoring end effects, the electric field in an induction coil is circumferential, is of maximum strength in the immediate vicinity of the pipe wall, and diminishes in strength with distance from the pipe wall.

Desirable 60 Hz (powerline frequency) electric field strengths due to magnetic induction are on the order of 0.1 to 1.0 volts per meter (1 to 10 millivolts per centimeter). More desirably, electric fields 10 to 100 times this strength are used to affect the charge layer as described by the Zeta-potential surrounding charged particles and or cell walls. A table of calculated induced E (electric) field values (at 60 Hz frequency) for various-sized devices is presented below.

TABLE 1

60 Hz E FIELD AT PIPE WALL (FROM FARADAY'S LAW)

| Pipe D" | B(rel) | B(estimated peak) | E Field at wall, peak |
|---|---|---|---|
| 1" | 1.0 | 450 Gauss = 0.045 T | 0.11 V/m (1.1 mV/cm) |
| 2" | 0.67 | 0.03 Tesla | 0.14 V/m |
| 3" | 0.62 | 0.0278 T | 0.20 V/m |
| 4" | 0.58 | 0.0264 T | 0.25 V/m |
| 6" | 0.41 | 0.0183 T | 0.26 V/m |
| 8" | 0.55 | 0.0247 T | 0.47 V/m |
| 10" | 0.44 | 0.0198 T | 0.47 V/m |
| 12" | 0.29 | 0.0131 T | 0.38 V/m (3.8 mV/cm) |
| 16" | 0.55 | 0.0247 T | 0.95 V/m (9.5 mV/cm) |

The induced electric field strengths at the 10 to 50 kHz "ringing" frequency designs are approximately five to eight times the 60 Hz field strengths, as given in Table 1, with the present driving circuit. So the induced (magnetic-field generated) electric fields can be as large as 70 mV/cm at the "ringing" frequency. This field strength is understood to be at the lower range of "effectiveness" for the Zeta-potential model.

The invention includes a controller means. The controller means is desirably a microprocessor. However, simpler circuits and components can be used for the controller means. The controller means for embodiments applying a magnetic field includes a switching means for regulating the current to the apparatus from a power source. The components can vary to provide the switching means for the embodiment of the invention having for applying a magnetic field.

Parameters and elements of the apparatus of FIGS. 1 through 6, 9, and 10 are disclosed in U.S. Pat. No. 6,063,267 to Crewson et al., which is incorporated herein by reference. These parameters and elements are desirable for use with this invention. These parameters include the nominal pipe size, arrangement of coils in terms of turns, gage, and length, tuning capacitor capacitance, and associated nominal power supply voltage as presented in the chart of FIG. 10.

Figure 4:
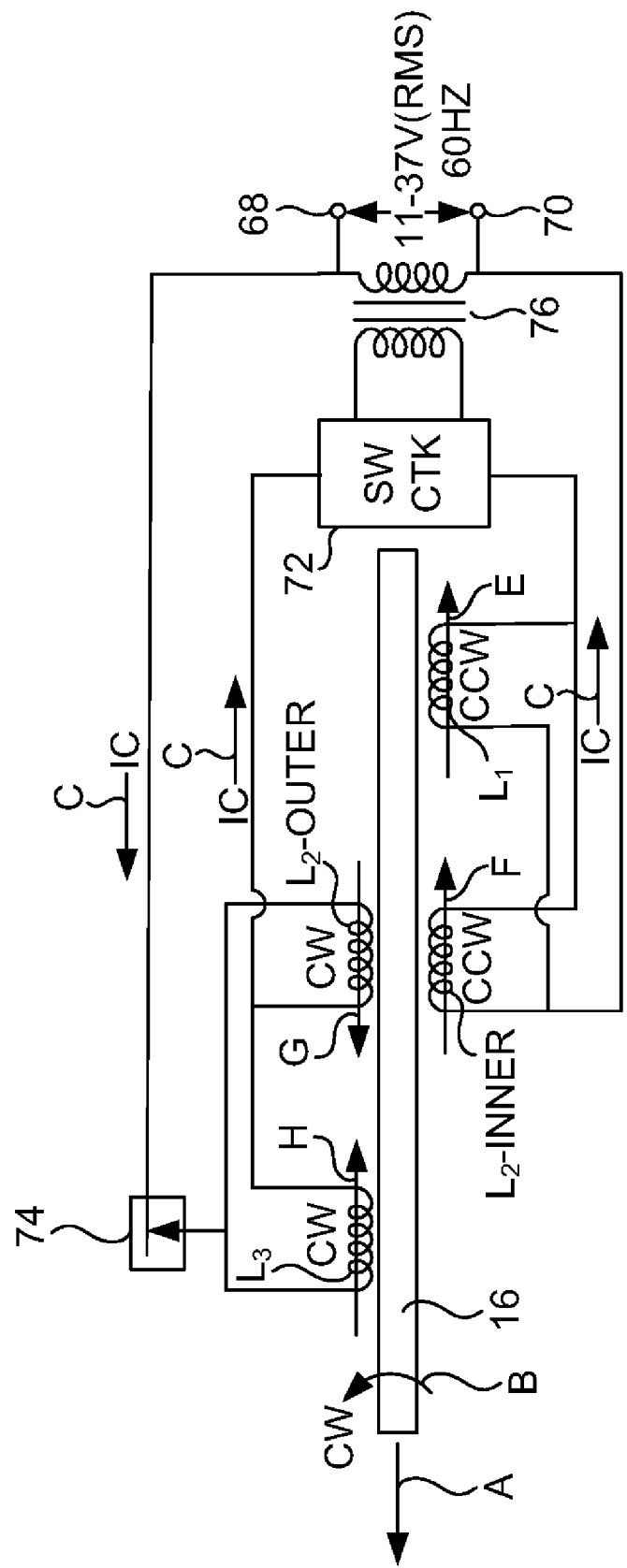
FIG. 4 is a simplified schematic circuit diagram for use with the invention.
Figure 5:
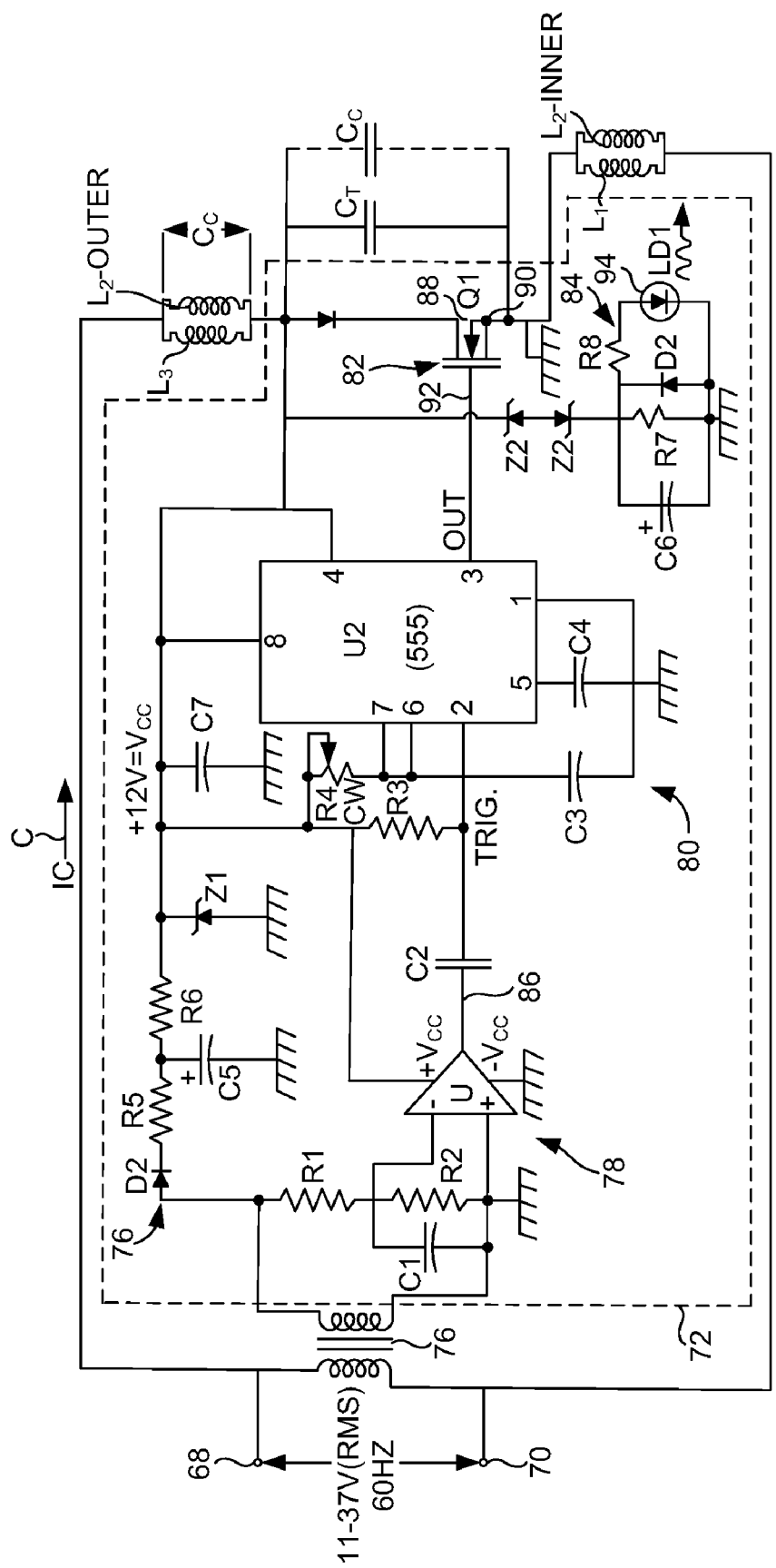
FIG. 5 is a detailed schematic diagram of one embodiment of an electrical circuit for use with the invention.
Figure 6:
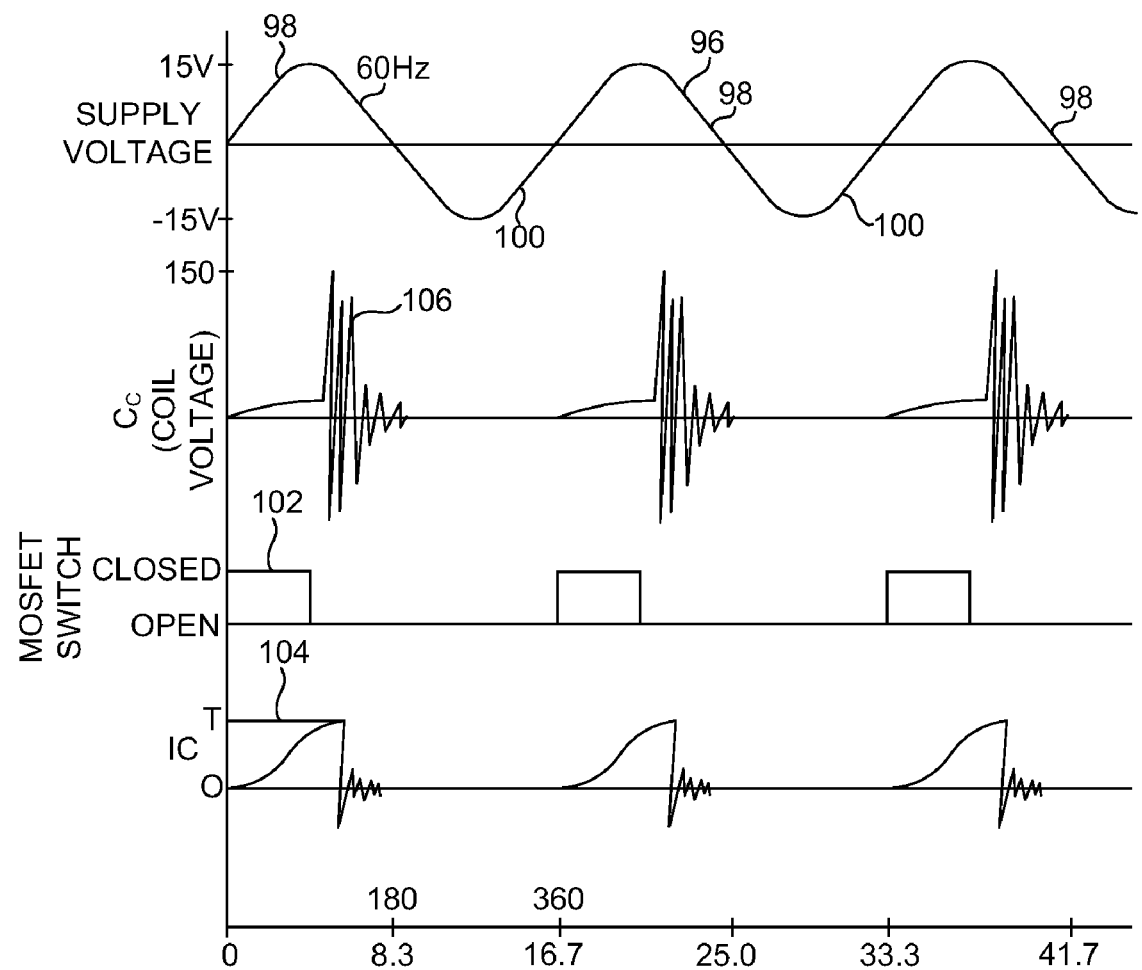
FIG. 6 is a diagram showing certain wave shapes produced by a water treatment device during operation.

The circuit of the switching means illustrated in FIGS. 4, 5, and 6 is one which is operable to produce one period of ringing current and ringing voltage for each alternate half cycle of the applied supply voltage. However, if desired, the switching circuit can also be designed to operate in a full wave mode wherein a period of ringing current and of ringing voltage is produced for each half cycle of the supply voltage.

FIG. 5 illustrates a desirable electrical circuit of the controller means for controlling the application of a magnetic field. The switch 82 may take various different forms and may be a sub-circuit consisting of a number of individual components. The preferred embodiment of the switch is based on the use of three terminals 88, 90, and 92, as may be typified by a transistor, triode, or gated diode. In this embodiment, the switch functions as both a switch and an amplifying circuit. The switch may also take the form of a sub-circuit consisting of a diode and an amplifier. Switches based on an array of two lead diodes in which some of the diodes are biased in order to provide amplification are also possible, as are switches consisting solely of two lead diodes which do not include amplification of the signal. The preferred embodiment is desirably a three-terminal or triode switch having first, second, and third terminals 88, 90, and 92, respectively. In this embodiment, the third terminal 92 is a gate terminal and the switch is such that, by the application of electrical signals to the gate terminal 92, the switch can be switched between an ON condition at which the first and second terminals are closed relative to one another and an OFF condition at which the first and second terminals are open relative to one another.

The embodiment of FIG. 5 illustrates the switch 82 as a single MOSFET (Q1). The MOSFET (Q1) sets the terminals 88 and 90 to a closed condition relative to one another, as soon as the voltage applied to the gate terminal 92 becomes positive as a result of the input AC voltage appearing across the input terminals 68 and 70. This condition in turn allows current to build up in the coils $L_1$, $L_2$-inner, $L_2$-outer, and $L_3$. When the time constant formed by the product of the resistor R4 and the capacitor C3 has elapsed, the 555 chip U2 reverts to a low output at pin 3 turning the MOSFET (Q1) to its OFF condition. When this turning off of (Q1) occurs, any current still flowing in the coils is diverted to the capacitance which appears across the terminals 88 and 90 of (Q1). As shown in FIG. 5, this capacitance is made up of the wiring capacitance $C_c$ arising principally from the close association of the two coils $L_2$-inner and $L_2$-outer. This winding capacitance can of itself be sufficient for the purpose of creating a useful series resonant circuit with the coils, but if additional capacitance is needed, it can be supplied by a separate further tuning capacitor ($C_t$).

When the switch (Q1) turns to the OFF or open condition, any current still flowing in the coils is diverted to the capacitance ($C_c$ and/or $C_t$) and this capacitance in conjunction with the coils and the power source form a series resonant circuit causing the current through the coils to take on a ringing wave form and thereby produce a ringing electromagnetic flux through the liquid in the pipe 16. By adjusting the variable resistor R4, the timing of the opening of the switch (Q1) can be adjusted to occur earlier or later in each operative half cycle of the AC input voltage. Preferably, the circuit is adjusted by starting with R4 at its maximum value of resistance and then slowly adjusting it toward lower resistance until the LED indicator 94 of the indicator subcircuit 84 illuminates. This illumination occurs when the peak voltage developed across the capacitance ($C_c$ and/or $C_t$) exceeds 150 V, at which voltage the two Zener diodes Z2 can conduct. The Zener diodes charge capacitor 62, and the resulting voltage turns on the LED 94. When this indicator LED lights, the adjustment of the resistor R4 is then turned in the opposite direction until the LED just extinguishes, and this action accordingly sets the switch (Q1) to generate a 150 V ringing signal.

FIG. 6 illustrates the function of the circuit of FIG. 5 by way of wave forms which occur during the operation of the circuit. Referring to this figure, the wave form 96 is that of the AC supply voltage applied across the input terminals 68 and 70, the voltage being an alternating one having a first set of half cycles 98 of positive voltage alternating with a second set of half cycles 100 of negative voltage. The circuit of FIG. 5 is one which operates in a half wave mode with periods of ringing current being produced in the coils of the pipe unit only in response to each of the positive half cycles 98. The wave form 102 represents the open and closed durations of the switch (Q1). During each positive half cycle 98 of the supply voltage, the switch (Q1) is closed during an initial portion of the half cycle and is opened at a time well in advance of the end of that half cycle with the exact timing of this occurrence being adjustable by the adjustable resistor R4.

The opening and closing of the switch (Q1) produces the current wave form indicated at 104 in FIG. 6. Each positive half cycle of the supply voltage is such that the current through the coils increases from zero during the initial portion of the half cycle, during which the switch (Q1) is closed, and then upon the opening of the switch (Q1) the current rings for a given period of time. The voltage appearing across the coils of the pipe unit is such as shown by the wave form 106 of FIG. 6. The voltage upon the opening of the switch (Q1) takes on a ringing shape having a maximum voltage many times greater than the voltage provided by the power supply 14.

The frequency of the ringing currents produced in the coils and of the ringing voltages produced across the coils can be varied by altering the capacitance ($C_c$ and/or $C_t$) appearing across the switch (Q1) and is preferably set within the range of 10 kHz to 80 kHz.

Figure 7:
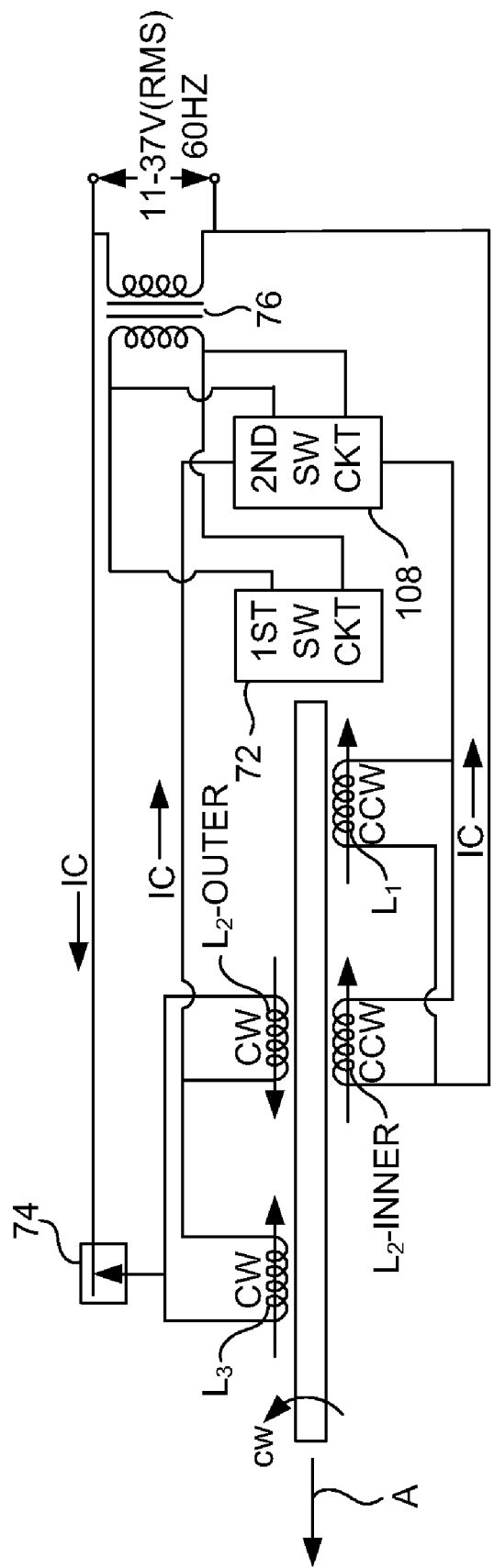
FIG. 7 is an alternative circuit diagram similar to FIG. 4.

FIG. 7 illustrates that this mode can be accomplished by modifying the circuit of FIG. 4 to add a second switching circuit 108, which is identical to the first switching circuit 72 except for facing currentwise and voltagewise in the opposite direction to the first circuit 72. In FIG. 7, the first circuit 72 operates as described above during each positive half cycle of the applied voltage, and the second circuit 108 operates in the same way during the negative half cycles of the applied voltage. As a result, the periods of current and voltage ringing over a given period of time is doubled in comparison to the device having periods produced in the same period of time by the circuit of FIG. 4.

Figure 8:
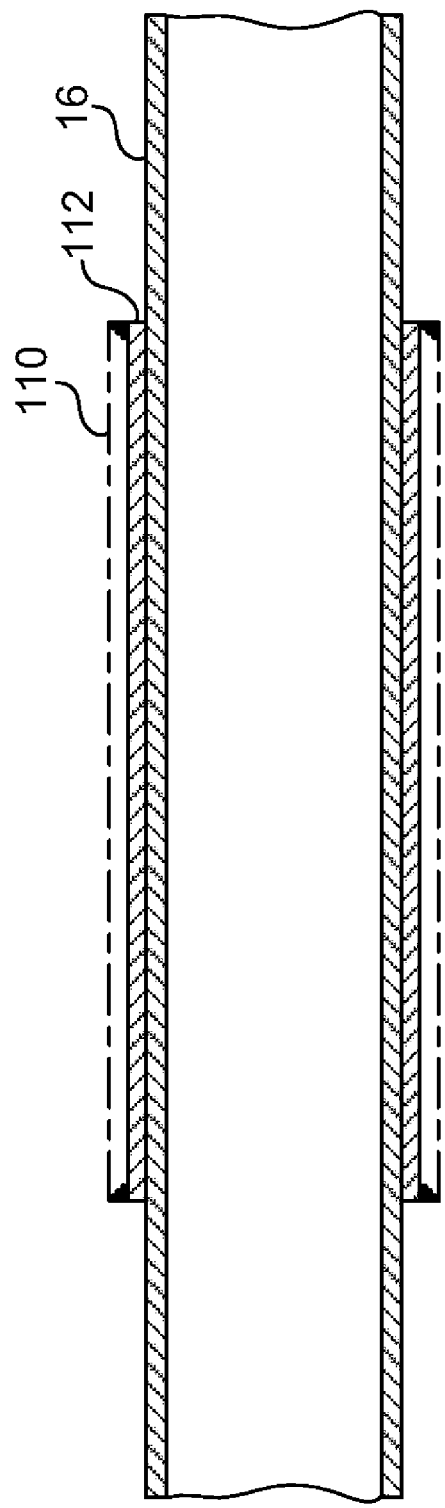
FIG. 8 is view similar to FIG. 3 but showing a modified embodiment of the pipe unit with only one coil surrounding the liquid flow pipe.
Figure 9:
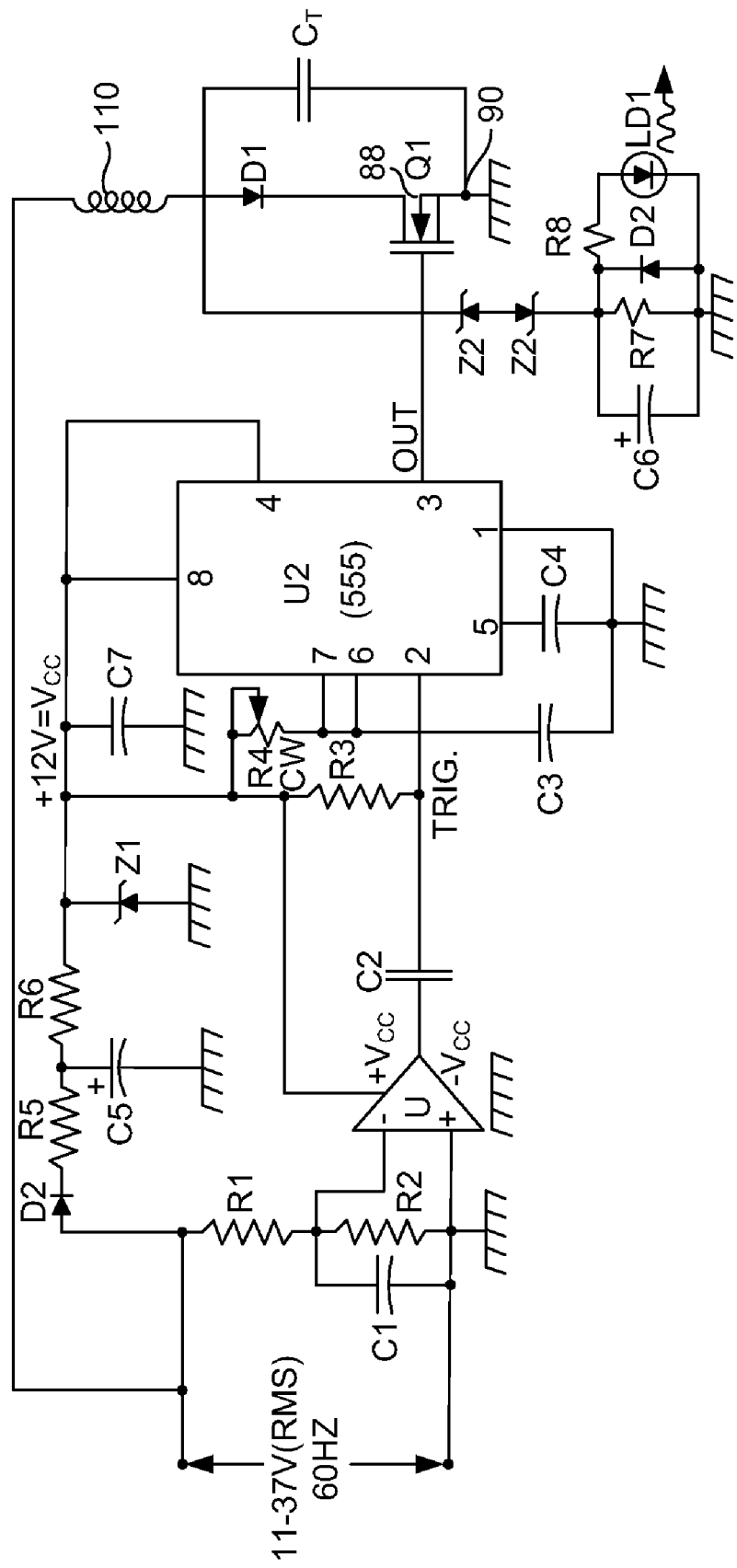
FIG. 9 is a detailed circuit diagram similar to FIG. 5 but showing an electrical circuit for use with the pipe unit of FIG. 8.

The coils used in the pipe unit 12 can be varied and, if desired, the pipe unit 12 can be made with only one coil without departing from the invention. FIGS. 8 and 9 relate to such a construction. FIG. 8 shows the pipe unit with a single coil 110 wound on a bobbin 112 and surrounding the pipe 16. The switching circuit used with the single coil pipe unit of FIG. 8 is illustrated in FIG. 9. It is generally similar to that of FIG. 5 except that, because the single coil 110 produces no significant wiring capacitance, it is necessary to provide the tuning capacitor ($C_t$) across the first and second terminals 88 and 90 of the switch (Q1). Further, since the coil means is made up of the single coil 110 and located entirely on one side of the switch (Q1), it is unnecessary to provide the isolation transformer 76 of FIG. 5 to establish a local ground for the components of the switching circuit.

Figure 11:
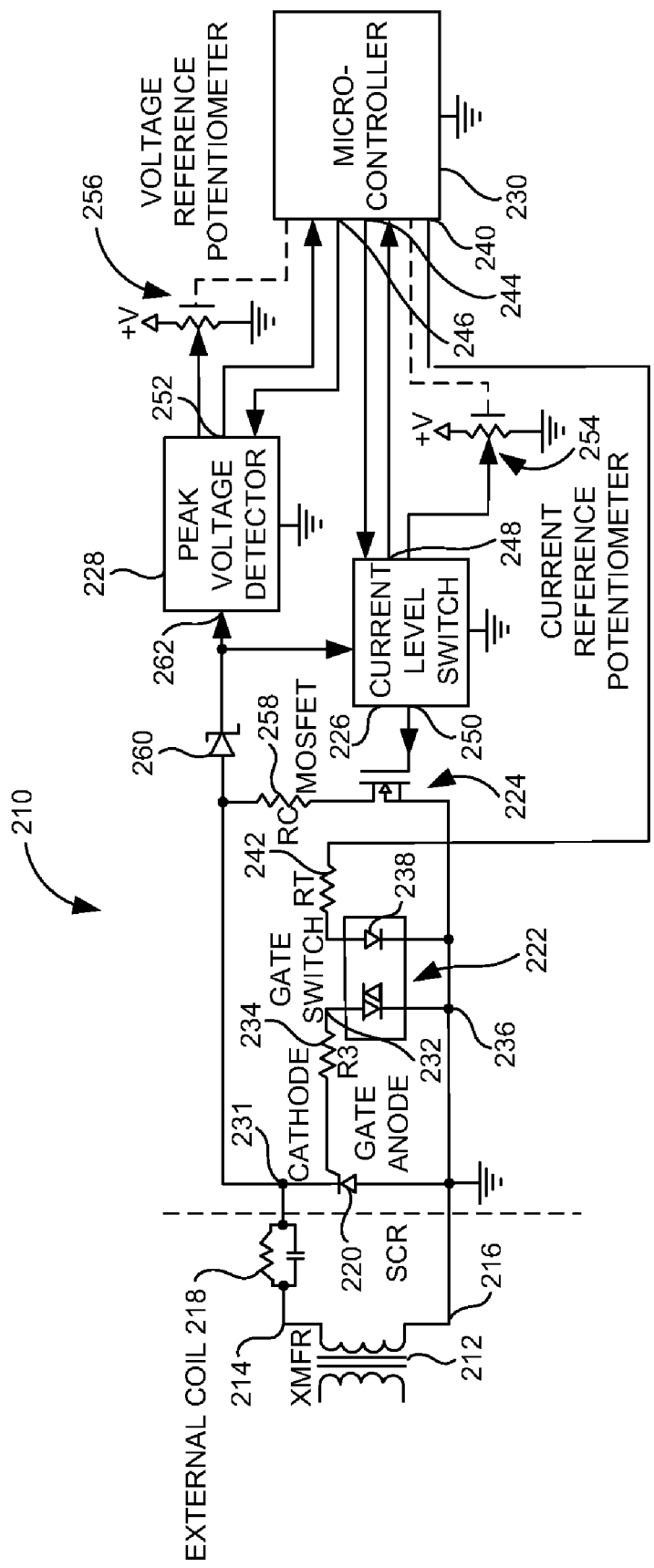
FIG. 11 is a schematic circuit diagram of a system for generating a ringing magnetic pulse for treating flowing liquid in accordance with an embodiment of the invention.

FIG. 11 illustrates an alternative controller means for use with the invention. This embodiment is a system for generating a ringing magnetic pulse for treating flowing fluids or liquids. The system 210 comprises an input power transformer 212 having first and second output terminals 214, 216, a coil 218, an SCR 120, a triac 122, a MOSFET 224 serving as an electronically controlled switch, a current level switch 226, a peak voltage detector 228, and a programmable digital microcontroller 230.

The digital control systems for generating a ringing magnetic pulse can be modified in order to be of simpler construction and less expensive by substituting a single silicon controlled rectifier (SCR) switch for a MOSFET switch assembly. SCRs are available with higher current ratings and lower losses relative to MOSFETs, and a single device can easily handle the coil current. However, SCRs cannot be electronically turned off as can a MOSFET, so that the high voltage "ringing" pulse has to be produced some other way than by interrupting the coil current pulse.

FIG. 11 illustrates the coil 218, which has an inductance and a capacitance connected in parallel. The coil 218 has a first end coupled to the first terminal 214 of the transformer 212. The illustrated capacitance can be comprised solely of the capacitance of the coil, but in some coils the stray capacitance can be supplemented by a discrete capacitor converted in parallel with the coil. The SCR 220 has a cathode coupled to a second end 231 of the coil 218 and an anode coupled to the second output terminal 216 of the transformer 212. As shown, the anode of the SCR 220 is coupled to electrical ground. The triac 222 serves as an SCR gate switch. As shown in FIG. 11, the triac 222 is an optically-coupled triac having a first terminal 232 coupled to the gate of the SCR 220 via a gate resistor 234 and a second terminal 236 coupled to ground potential. The triac 222 can further include a light-emitting diode (LED) 238 that, when energized to emit light, closes the gate switch to enable current flow between the first and second terminals 232, 236 of the triac 222.

The microcontroller 230 includes a first output 240 coupled to an anode of the LED 238 via a resistor 242, a second output 244 coupled to the current level switch 226, and a third output 246 coupled to the peak voltage detector 228. The current level switch 226 includes a first output 248 coupled to the microcontroller 230 and a second output 250 coupled to the gate of the MOSFET 224. The peak voltage detector 228 includes an output 252 coupled to the microcontroller 230. A digitally controlled current reference potentiometer 254 is coupled to an input of the current level switch 226 and is adjustable by the microcontroller 230. A digitally controlled voltage reference potentiometer 256 is coupled to the peak voltage detector 228 and is adjustable by the microcontroller 230.

The MOSFET 224, such as the illustrated n-channel IGFET with substrate tied to source, includes a source coupled to ground potential and a drain coupled to the second end 231 of the coil 218 via a current sense resistor 258. A high voltage Schottky diode 260 has an anode coupled to the second end 231 of the coil 218 and a cathode coupled to an input 262 of the peak voltage detector 228.

The system 210 is preferably mounted on a printed circuit board (not shown). However, two components are preferably external to the printed circuit board (PCB), namely, the coil 218 and the power transformer 212. The transformer 212 provides a 50 to 60 Hz AC voltage to power the coil 218. The main power component on the PCB is the SCR 220 which is preferably heat-sinked and which functions as a controllable diode. When an SCR is forward-biased, it does not conduct current unless the gate (control) lead is also forward-biased.

When the SCR gate lead is connected to its anode (via a resistor), the SCR conducts current when the SCR anode is positive with respect to its cathode. This condition occurs during the negative voltage half-cycle as referenced to the SCR anode which is considered to be circuit ground in FIG. 11. Since the coil 218 is predominantly inductive with some small internal resistance at 60 Hz, negative current continues to flow for a large portion of the positive voltage half-cycle. When the current drops to zero, the SCR 220 blocks positive current flow from cathode to anode. When the SCR 220 turns off, the voltage across the SCR jumps to a positive level during the remainder of the positive voltage half-cycle. It is during this positive voltage period that the microcontroller 230 generates resonating current and voltage pulses within the coil 218.

A ringing voltage pulse across the coil 218 is created by first closing the MOSFET solid-state switch 224 for a brief period at any time during the positive voltage cycle when the SCR 220 is off. The MOSFET 224 is closed, or made to conduct, by applying a positive voltage to its control electrode or gate via the current level switch 226. Positive current builds up in the coil 218 while the MOSFET 224 is closed. The rise time is determined by the value of the current sense resistor 258 and the inductance of the coil 218. When the current level reaches a designated trigger value, the MOSFET switch 224 is abruptly opened by the current level switch 226. The current level switch removes the positive voltage from the gate of the MOSFET 224, which causes the MOSFET to become non-conducting. The inductance and capacitance values of the coil 18 determine the frequency of the resulting resonating current flow within the coil and the magnitude of the ringing voltage as viewed across the SCR 220. The decay time of the ring is determined by the internal resistance of the coil 218. Multiple ringing pulses can be generated during the positive voltage period.

The gate resistor 234 of the SCR 220 must be disconnected from the anode of the SCR during the positive voltage period to prevent the SCR from turning on when ringing pulses are generated—which quickly terminates the ring. The preferred method for switching the gate resistor 234 was determined to be an optically-coupled triac as shown in FIG. 11. The triac 222 need only be energized prior to the start of the negative voltage half-cycle. Once current starts to flow in the SCR 220, the triac 222 can be de-energized. The SCR 220 will continue to conduct until current drops to zero and the cathode-to-anode voltage across the SCR is positive. A small ringing pulse in the coil 218 occurs when the SCR 220 switches off which is caused by the charge stored in the coil capacitance.

The operation of the system 210 is primarily implemented using the programmable digital microcontroller 230 coupled to and aided by the peak voltage detector 228 and the current level switch 226. The microcontroller 230 does not directly interface with the coil 218, the SCR 220, and the MOSFET 224—nor does the microcontroller directly view the coil voltage level. The coil voltage is presented to the current level switch 226 and the peak voltage detector 228 through the high voltage Schottky diode 260. The current level switch 226 and the peak voltage detector 228 compare the incoming voltage level to a reference voltage level set by the digitally controlled potentiometers 254, 256, respectively to determine its action.

The primary function of the peak voltage detector 228 is to compare the level of the coil ringing voltage signal to the reference level set by the digital potentiometer 256 associated with the peak voltage detector. If the peak level exceeds the given reference level, the peak voltage detector 228 stores that event so that it can be later read by the microcontroller 230. The stored event is cleared after it is read by the microcontroller 230. The peak voltage detector 228 is used to determine that the peak voltage exceeds the minimum desired value and also that it does not exceed a maximum value. A secondary function of the peak voltage detector 228 is to determine the value of the transformer voltage on start-up.

The microcontroller 230 needs to monitor the transformer voltage because the ring signal rides on top of the transformer voltage. The transformer voltage reading is added to the desired ring voltage level when the reference voltage is set.

The current level switch 226 controls the MOSFET 224 used to generate the coil ringing pulse. The microcontroller 230 sends a trigger pulse to the current level switch 226 to initiate a ring. When triggered, the current level switch 226 raises the voltage on the gate lead of the MOSFET 224, thereby turning it on. The "on" resistance of the MOSFET 224 is much less than the value of the current sense resistor 258. The MOSFET 224 is held "on" until the voltage at the current sense resistor 258—coil junction (the cathode of the SCR 220) exceeds the reference voltage set by the current reference potentiometer 254 associated with the current level switch 226. The value of the resistor 258 and the reference voltage is not as important as ensuring that the current value at which the MOSFET 224 turns off is repeatable for a given potentiometer setting. The role of the microcontroller 230 is to adjust the potentiometer 254 of the current level switch 226 to achieve the desired voltage level for the coil "ring."

The overall operation of the microcontroller 230 is executed in software embedded within the microcontroller. The functions of that software program are now described. When the system 210 is first powered-up, the SCR 220 and the MOSFET 224 are both off (i.e., no current flows through the coil 218). The first task of the microcontroller 230 is to test for the presence of coil power voltage from the transformer 212. This task can be accomplished by setting the peak voltage detector 228 at a low level and monitoring the output. An alternative method is to monitor a tap provided in the current level switch 226 which reads zero when the coil voltage is negative and rises to −5V when the coil voltage goes positive. The microcontroller 230 waits until it observes two alternating 50 to 60 Hz power line voltage cycles before proceeding. When the AC coil voltage is detected, the microcontroller 230 measures its peak level by monitoring the output of the peak voltage detector 228 while it raises the level of the voltage reference potentiometer 256. The peak level reading is retained in the microcontroller 230 and used as an offset for adjusting the level of the generated ring pulses which ride on the coil power voltage.

The next software task is to turn on the SCR 220, which is a periodic task occurring once per voltage cycle. Just before the end of the positive voltage period (the SCR anode-to-cathode voltage is negative during this "positive" period, as the SCR anode is used as the ground-reference), the SCR gate switch or triac 222 is turned on by powering its optically coupled LED 238. When the negative voltage across the SCR 220 is approximately two volts, the SCR begins to conduct current at which time power to the gate switch LED 238 is removed. The SCR 220 remains latched on without the gate switch 222 being powered, until the SCR 220 current flow drops to zero.

The ringing pulses are produced by a second periodic software task. This task waits until the SCR 220 turns off and a positive coil voltage is detected (which is a sharp jump nearly the height of the peak coil voltage). The task waits a few milliseconds to allow the small coil ring (which occurs when the SCR 220 turns off) to die. To generate a high voltage ringing pulse, the software sends a trigger signal to the current level switch 226, which turns on the MOSFET 224, allowing positive current flow to rise in the coil 218. The task monitors the current level switch 226, waiting for the current level switch to signal that the current level has risen to the trigger point and the MOSFET 224 has turned off. The task waits for a few milliseconds to ensure that the coil ring has died before proceeding. As many as six ring pulses can be generated within the positive coil voltage period.

During the negative voltage period, the microcontroller 230 determines if the peak voltage detector 228 has been triggered, which indicates that ringing signal exceeded the reference level set in the voltage reference potentiometer 256. The voltage reference potentiometer 256 can be set to either the minimum or the maximum desired peak voltage level. If the voltage reference potentiometer 256 is set for the minimum peak voltage, and the peak voltage detector 228 has not been triggered, the microcontroller 230 increases the level of the current reference potentiometer 254 and leave the voltage reference potentiometer 256 at the minimum level. If the voltage reference potentiometer 256 is set for the minimum peak voltage, and the peak voltage detector 228 has been triggered, the microcontroller 230 holds the level of the current reference potentiometer 254 and change the voltage reference potentiometer 256 to the maximum level. If the voltage reference potentiometer 256 is set to the maximum level, and the peak voltage detector 228 has been triggered, the microcontroller 230 decreases the level of the current reference potentiometer 254 and leaves the voltage reference potentiometer 256 at the maximum level. If the voltage reference potentiometer 256 is set to the maximum level, and the peak voltage detector 228 has not been triggered, the microcontroller 230 holds the level of the current reference potentiometer 254 and changes the voltage reference potentiometer 256 to the minimum level. The preceding actions move and hold the peak voltage level for the ring pulse between the minimum and maximum desired values. The above logic pattern serves as a digital voltage regulator for the ringing voltage pulse.

Also during the negative voltage period, the microcontroller 230 reads the resistance value of a negative temperature coefficient (NTC) thermistor (not shown) affixed to the heat sink of the SCR 220. If the resistance drops below the value equated to the maximum temperature designated for the SCR heat sink (which is lower than destruction level for the SCR 220) the microcontroller 230 turns off the SCR and also ceases generating ringing pulses. The microcontroller 230 continues to read the thermistor periodically, and when it is determined that the SCR temperature has dropped to a safe level, the microcontroller automatically resumes operation.

On the bottom of the printed circuit board can be two status LEDs (not shown)—preferably one red and one green—viewable through holes in a controller cover. The green LED is lit when the microcontroller 230 has determined that the voltage level of the ringing pulses is within the desired range. Otherwise the red LED is lit. A single-pole double-throw relay contact (not shown) is preferably provided for remotely monitoring the status—when the green LED is lit the relay is energized.

The SCR-switched circuit or controller means functions is as follows. The SCR does not conduct when forward-biased unless a current is made to flow in its "gate" circuit. If no gate current is applied, the SCR "blocks" the flow of current even when forward-biased. The SCR blocks the flow of current when the direction of current flow reverses (cathode to anode is the reverse-current direction). The SCR cannot be turned off by removing its gate current after it has been turned on. It can only be turned off by reversing the direction of current flow.

A normal cycle of the device proceeds as follows. The coil, transformer, and SCR switch are all connected in series. When the time-varying (50 or 60 cycles per second) transformer voltage applies a forward bias to the SCR, gate current is applied and the SCR conducts current through the coil. The SCR has a very low voltage drop from anode to cathode when conducting (less than or equal to one volt typically), so it performs as an almost-perfect switch. On the circuit boards of prior devices MOSFETs (Metal-Oxide-Silicon Field Effect Transistors) are used as the switch. These MOSFETs have a larger "forward" voltage drop than does an SCR and so dissipate more heat than the SCR. For this reason, in the prior devices ten parallel-connected MOSFETs are used to carry the coil current, where a single SCR performs in the same manner in devices according to certain embodiments of the invention with lower overall power loss.

When the coil current attempts to reverse direction, the SCR turns off and allows voltage to rise across it. The SCR then blocks current flow when the current reverses. Because the voltage and current across the coil are almost 90 degrees out of phase with each other, the current crosses zero (reverses) when there is still substantial voltage across the coil. This condition frees the coil to "ring" at a low voltage level due to the energy stored in its stray capacitance.

After this initial small or natural "ringing" pulse has died, a small current is allowed to build up in the coil by closing a MOSFET switch. This switch does not carry the main coil current, so a small switch can be used for this "recharging" function.

When this current has reached a preset level, the MOSFET is turned off, and the coil voltage "rings" again, this time producing a large ringing pulse at a higher voltage level, depending on the amount of current that is allowed to build up.

The regulator circuit measures the peak value of this "ringing" voltage and compares it to the desired value, which is stored as a number in the microprocessor "chip" on the circuit board. If the voltage is too low, then after the ringing pulse has died away the microprocessor turns the MOSFET on again and holds it "on" for a longer time, allowing more coil current to build up than before. The MOSFET is then turned off, and the large ringing pulse repeats.

If the pulse voltage is too high, the microprocessor reduces the "on time" of the MOSFET switch for the next pulse, causing less coil current to build up. The MOSFET then turns off, and the ringing voltage is again measured.

When the ringing voltage has reached the desired level (it falls within a "window" range of voltages stored in the microprocessor), the regulator "remembers" this and fixes the MOSFET "on" time for subsequent pulses at this value unless the pulse voltage drifts outside the "window" again. This can occur if the coil resistance changes as the coil temperature changes during operation. If that occurs, preceding steps are repeated until the voltage is once again within the "window."

All the large "ringing" pulses are generated during the interval when the SCR switch is reverse-biased by the applied circuit voltage from the power transformer. The SCR allows the ringing pulses to occur (its gate current is zero during this interval), even though the ringing pulse voltage at times causes the SCR voltage to switch over to the "forward" bias condition. The SCR does not turn on when this occurs, because its gate current is held to zero by the gate driver switch.

Several large ringing pulses can be inserted in this reverse-bias time interval. If more voltage is desired, the "voltage window" numbers stored in the microprocessor are increased. The regulator then operates as above to force the voltage upward. More time is then required to "charge" the coil with current so fewer pulses can be generated in the interval, and vice versa.

Other techniques can be used to generate ringing pulses similar to those described above. The preferred technique, as described above, uses the coil's inductance as an energy storage element to generate the ringing voltage, so it is a simpler method than others which must store the energy elsewhere. However, any device that stores the required pulse energy can be used to generate a ringing pulse. For example, a capacitor can be charged to 150 volts (or any other desired voltage) and switched across the coil during the "off time" of the coil current. This condition also generates a ringing pulse, but it requires a high voltage power supply and an extra capacitor. This method also increases the capacitance in the "ringing" circuit and causes a lower "ringing" frequency. The preferred method uses the unavoidable "stray" capacitance of the coil as the resonating capacitance and generates the highest possible ringing frequency.

The preferred control circuit of this embodiment can fit several, desirably six, large ringing pulses into the available "off" time window between transformer current pulses. The number of large ringing pulses is selectable by inputting a number to the control program via the computer programming interface.

Figure 12:
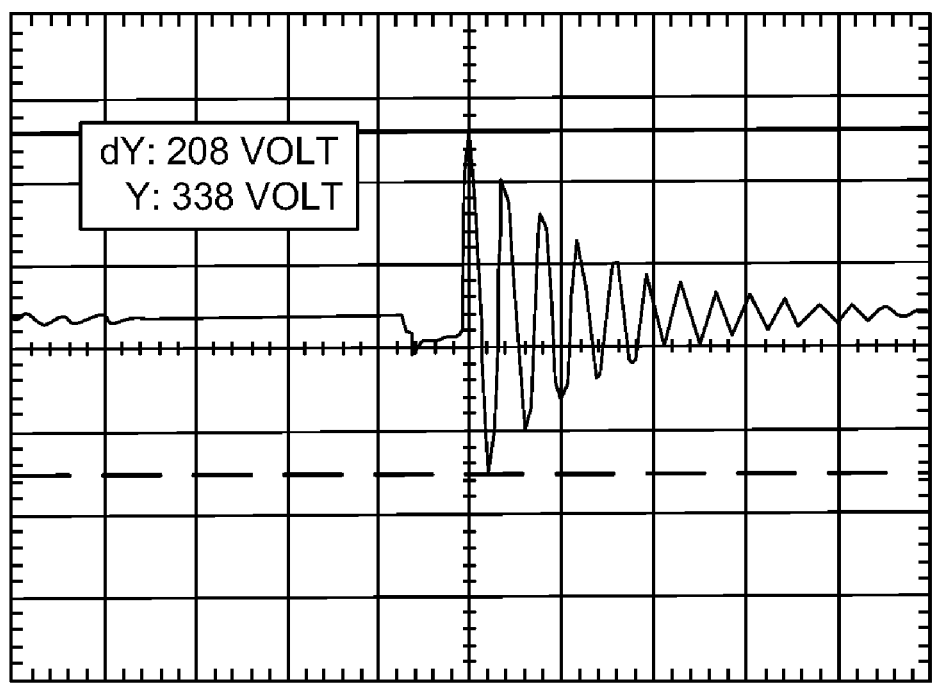
FIG. 12 is an oscilloscope trace showing a single large ringing pulse according to an embodiment of the invention.

FIG. 12 shows a single pulse from the group. The two horizontal cursor lines (white) are 208 volts apart. The sweep speed is 100 µs/division. The voltage scale is 50V/division.

Figure 13:
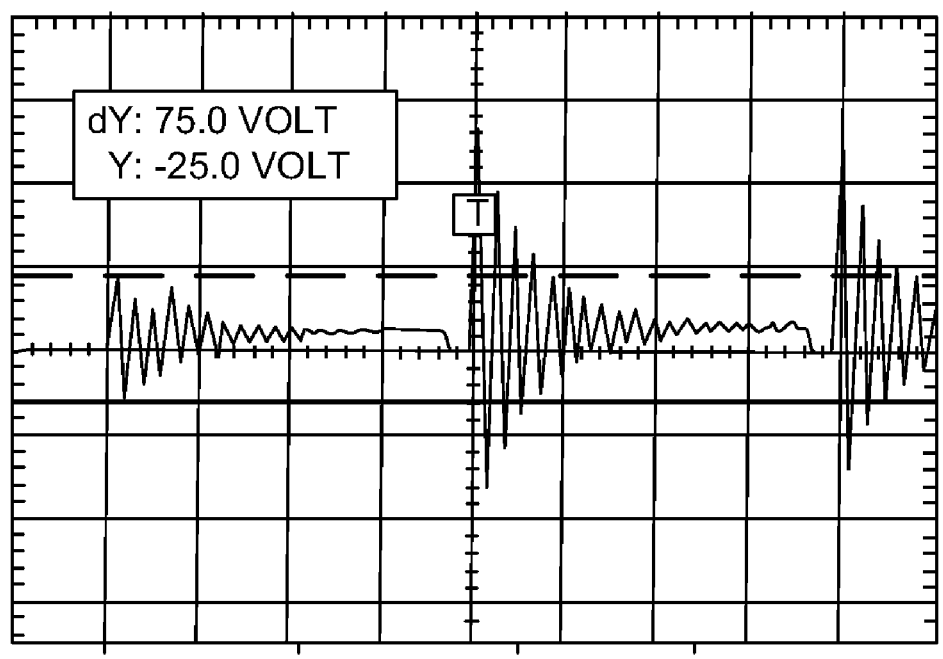
FIG. 13 is an oscilloscope trace showing a "natural" ringing pulse followed by more than one large ringing pulse according to an embodiment of the invention.

FIG. 13 illustrates the first "natural" ring when the SCR turns off, about 75 volts peak-to-peak. Then the large rings are caused by the control circuit. The large ringing pulses are between three and four times larger in voltage than the small "natural" ringing pulse. There is more than one large ringing pulse. The sweep speed is 200 µs/division and the voltage scale is 50V/division.

Figure 14:
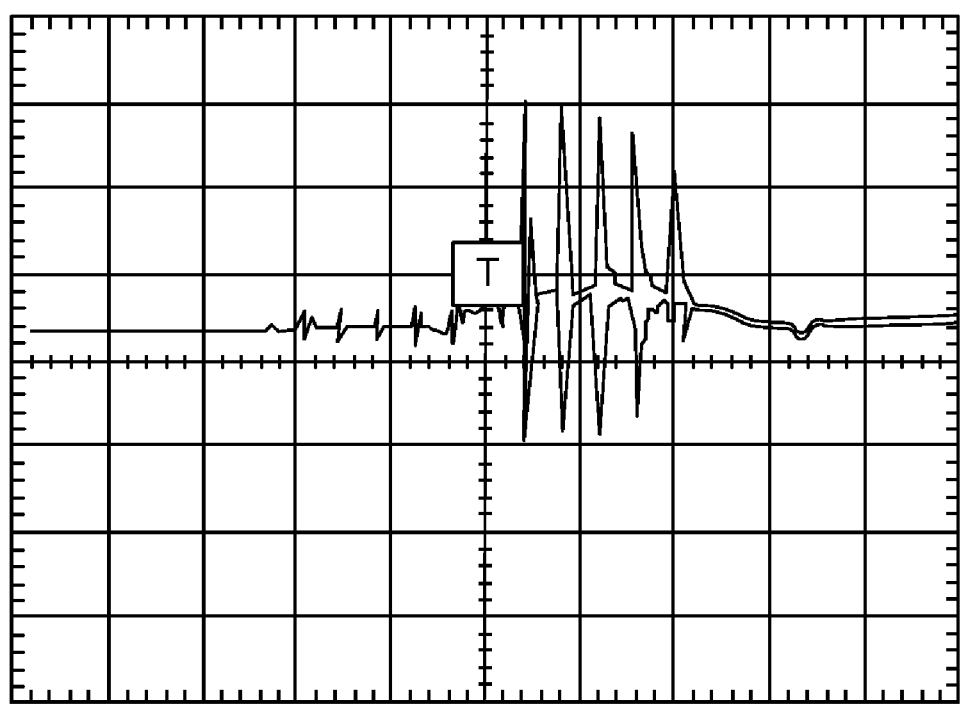
FIG. 14 is an oscilloscope trace showing a series of six full large ringing pulses according to an embodiment of the invention.
Figure 15:
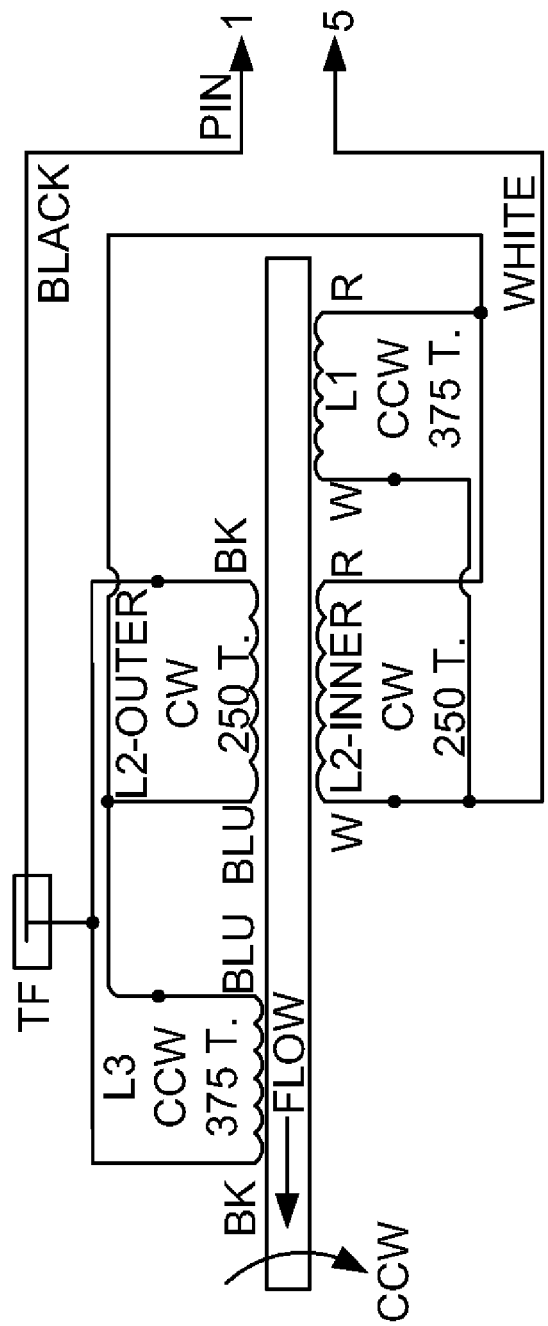
FIG. 15 is a schematic view of the coil arrangement, coil winding directions and coil terminal connections as disclosed in U.S. Pat. No. 6,063,267

FIG. 14 illustrates a full six large ringing pulses. These pulses fit into the approximately eight millisecond "SCR off" time for this size (one inch) device. With larger coils, this time can be shorter and fewer pulses fit. The sweep speed is 2 ms/division, and the voltage scale is 50V/division.

The system and method of this embodiment of controller means employs an SCR for controlling the main coil current and uses a single MOSFET switch to draw a relatively small current through the current coil(s) after the main current pulse has ended. One or more large ringing pulses are then produced by turning this switch off. Several ringing pulses can be produced in this way during the zero current interval through the coils, and the production of up to six pulses has been achieved.

Figure 16A:
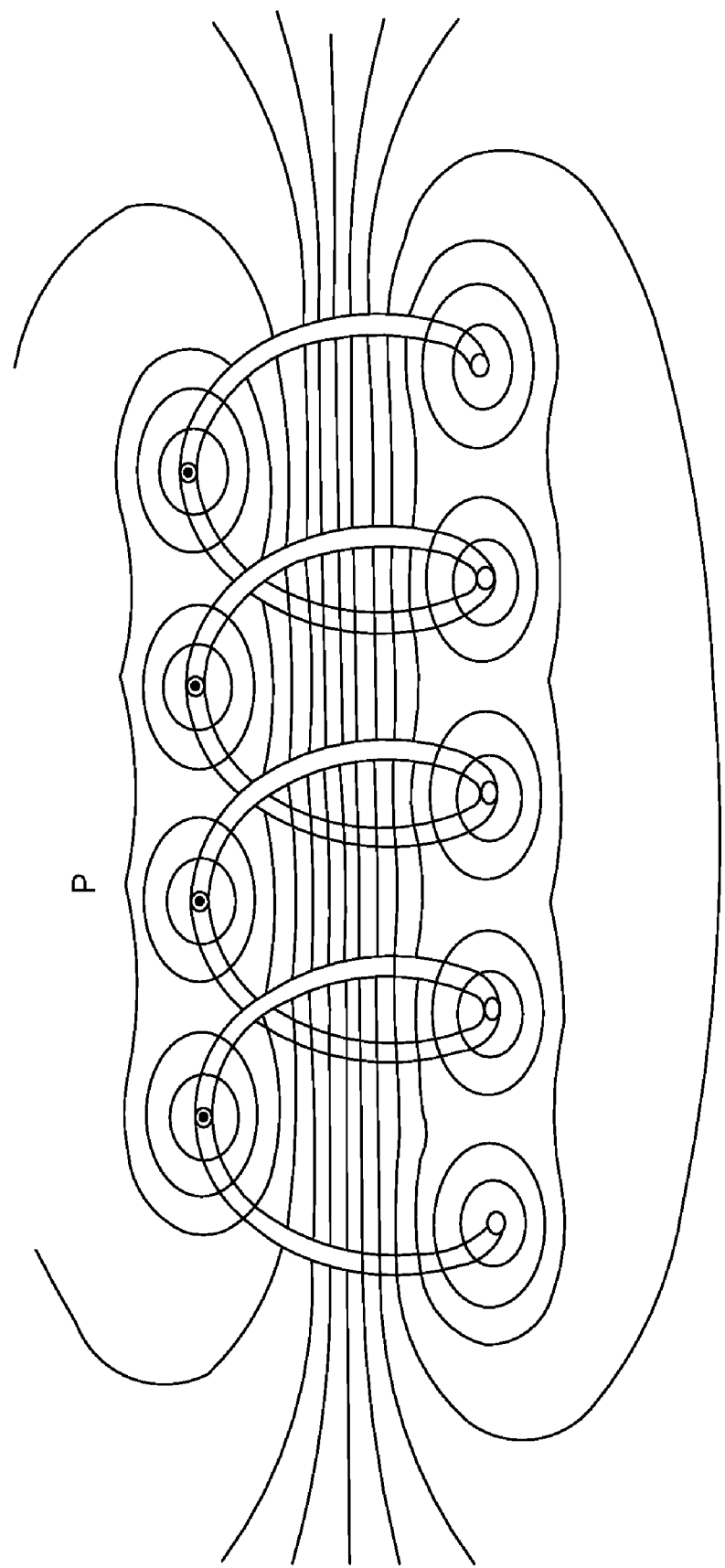
FIG. 16A is a schematic view of a loosely wound induction coil showing lines of magnetic flux.
Figure 16B:
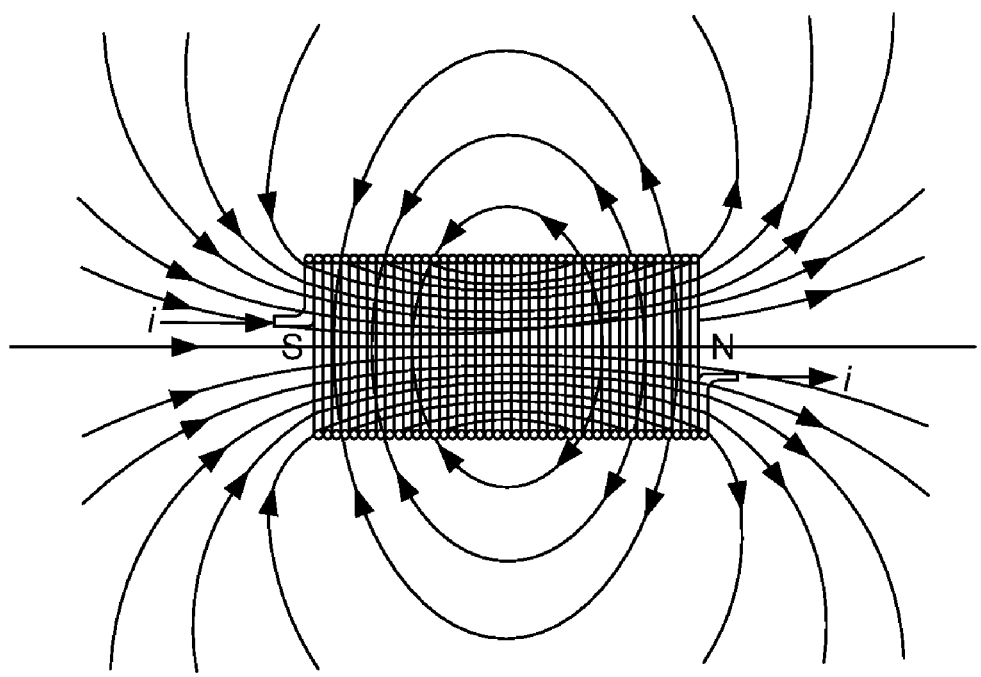
FIG. 16B is a schematic view of a tightly wound induction coil showing lines of magnetic flux.

FIGS. 16A and B are schematic views of loosely wound and tightly wound induction coils showing lines of magnetic flux. FIG. 16A of shows a loosely wrapped coil. It is the intent of this view to illustrate the precise manner in which magnetic fields form around current carrying wires. FIG. 16B shows a tightly wrapped coil. A comparison of FIGS. 16A and B shows that the lines of magnetic flux between the individual turns in the coil have substantially disappeared in the tightly wrapped coil due to interactions of the fields from each turn of wire. Of primary significance in both views is that the magnetic field formed by the passage of current through the coil is axial and uniform within the coils and that at the ends of the coils the field is divergent and non-uniform. The magnetic field is related to the current in the wire in both magnitude and direction. Given that the current in the wire varies in both strength and direction at frequencies of both 50 to 60 Hz (AC line frequency) and 10 to 50 kHz (coil ringing frequency), the magnetic fields shown in FIGS. 16 A and B represent an instant in time. The variations of the intensity and direction of the magnetic fields shown in FIGS. 16A and B with time creates an electric field at right angles (in accordance with the right hand rule to the magnetic field. The electric field varies in intensity and direction in accordance with the direction and strength of the magnetic field.

Figure 17:
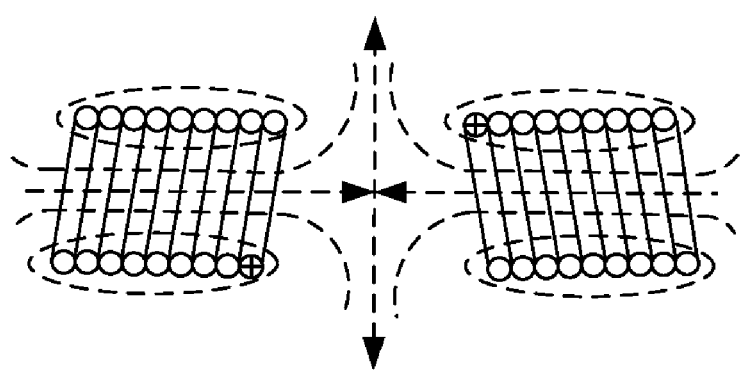
FIG. 17 is a schematic view showing the lines of magnetic flux which would result from placing a gap between the bucking coils shown in FIG. 15.

The first component described for use with invention pertains to the establishment of an axial gap between the bucking coils of the device. FIG. 17 shows the effects on the magnetic fields as a result of the establishment of a gap between these coils. A comparison of FIGS. 16B and 17 reveals that the field in the gap between the bucking coils is substantially intensified and more radial in direction than is the case for a single coil. Field intensification and direction modification are known to occur in gaps whose size varies from very small to approximately as large as the radius of the coil. When the bucking coils are powered at the voltages and frequencies typically used in the device water treatment (11 to 37 V (rms) at 50 to 60 Hz and 300 V at 10 to 50 kHz), gaps between approximately 1/16 inch and 1 inch (depending on the size of the device) are both practical to achieve and are known to affect the intensity and direction of the magnetic and induced electric fields.

The modification of the magnetic and electric fields near the gap in the bucking coils is considered to be beneficial to the water treatment process due to both intensified fields and rapid changes in the direction of fields with position. Intensified fields are considered to be more effective in disrupting cell membranes of microbiological life forms as well as removing surface charges on colloidal particles. Rapid changes in direction of fields with position are considered to be more effective in promoting collision and thereby agglomeration of colloidal particles. The net result of these benefits is enhanced biological control and precipitation of inorganic particles at locations other than heat transfer surfaces, i.e., the avoidance of scaling.

The second component described as useful with the invention pertains to the establishment of a potential difference between adjacent faces of adjacent coils. Implied in this component of the invention is that a gap of controlled dimensions also exists between the coils. Unlike the first component of this invention which can only occur between bucking coils, this component can be employed between either bucking coils or coils which are wound and powered to produce magnetic fields of similar directions.

Figure 18A:
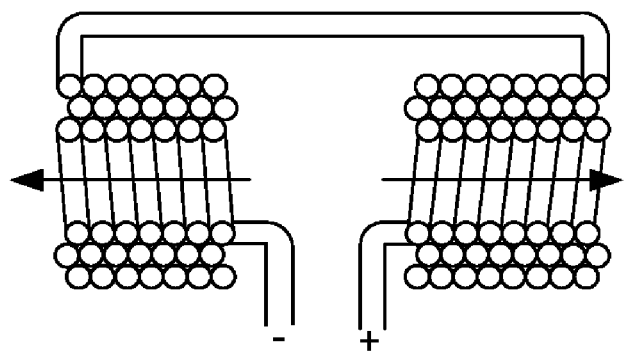
FIG. 18A is a schematic view showing the coil winding directions and coil termination connections necessary to create a potential difference between adjacent faces of two bucking coils.
Figure 18B:
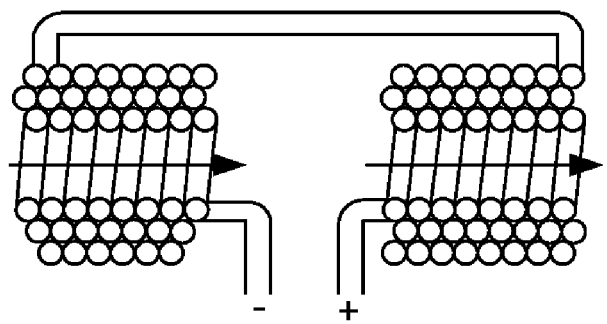
FIG. 18B is a schematic view showing the coil winding directions and coil termination connections necessary to create a potential difference between two coils having magnetic fields of similar directions.
Figure 18C:
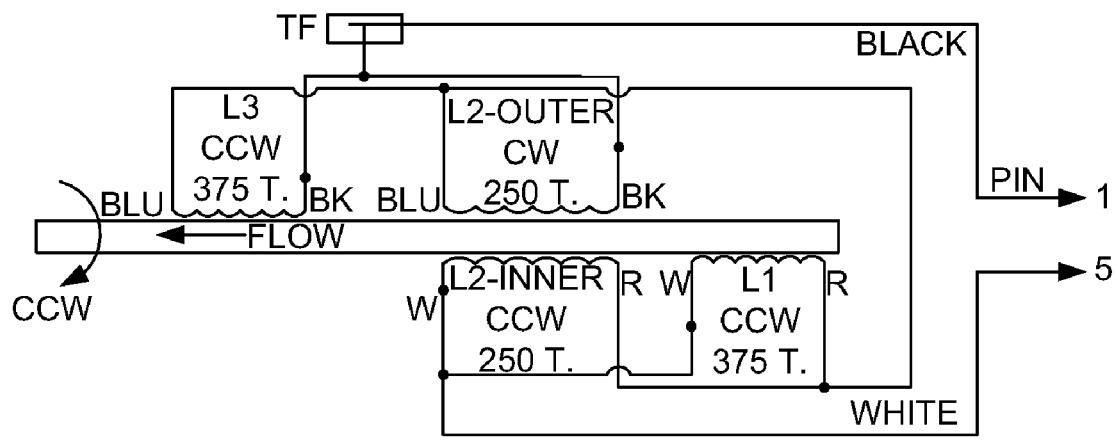
FIG. 18C is a schematic view showing the manner in which the coil connections necessary to create the potential difference between adjacent faces of two bucking coils in FIG. 18A would be incorporated into the complete circuit of FIG. 15.

FIGS. 18 A, B and C illustrate the winding directions and electrical connections necessary to create the desired potential difference between adjacent faces of bucking coils and coils which produce co-directional electric fields respectively. Irrespective of whether the coils between which the potential difference is to be created are designed to produce bucking or co-directional magnetic fields, the winding process must begin at the point of the coil which becomes the face adjacent to the other coil and is radially innermost. The final turn of the coil must end on the outermost surface of the coil at the end furthest from the adjacent coil.

The electric field created by the potential difference between adjacent faces of the coils has the potential to be the strongest electric field of all those created by the device. The electric field strength is a function of the potential difference between the adjacent leads to the coils (300 V max) and the distance between coils (small distances equate to high field strengths). The actual strength of the field which interacts with the water flowing through the pipe is significantly more complex and depends on the geometry of the coil, the fringing effects of the field near the edges of the coil, and the thickness of the pipe. These parameters can be most readily addressed by considering the adjacent faces of the coils as parallel plate capacitors. When idealized, the electric field between the plates of the capacitor is uniform in direction and intensity at all points between the plates and is nonexistent at all points outside the plates. In a real capacitor, the electric field is uniform in intensity and direction at points significantly removed from the edges of the plates. At points near the edges of the plates, including points that are outside the plates, the field is uniform neither in intensity nor in direction. The distance to which the electric field extends beyond the edges of the plates increases with the separation of the plates. For the electric field generated by the potential difference between adjacent faces of the coils to be effective in treating water flowing through the pipe, the fringes of the coil must extend through the pipe and into the water flow. When the coils are powered at the voltages and frequencies typically used in device water treatment (11 to 37 V (rms) at 50 to 60 Hz and 300 V at 10 to 50 kHz), gaps between approximately 1/16 inch and one inch (depending on the size of the device) are both practical to achieve and are known to affect the intensity of the electric fields. Additionally, given the time varying nature of the electric field produced by the potential difference between the adjacent faces of the coils, a circumferential magnetic field is produced in and around the gap. This field can be expected to influence the motion of charged particles and increase the probability that these particles will collide and agglomerate.

As may be seen from the previous discussion, the concept of treating water by electric fields resulting from potential differences between adjacent faces of the device coils is limited by geometric considerations. At best, only a small volume of water flowing near the pipe surface is subjected to electric fields of substantial strength. This limitation can be substantially overcome by the use of the third component of this invention: auxiliary electrodes. Electrodes can be positioned in a variety of configurations that can produce electric fields of varying strength, direction, and depth of penetration within the water flowing through the pipe.

Figure 19A:
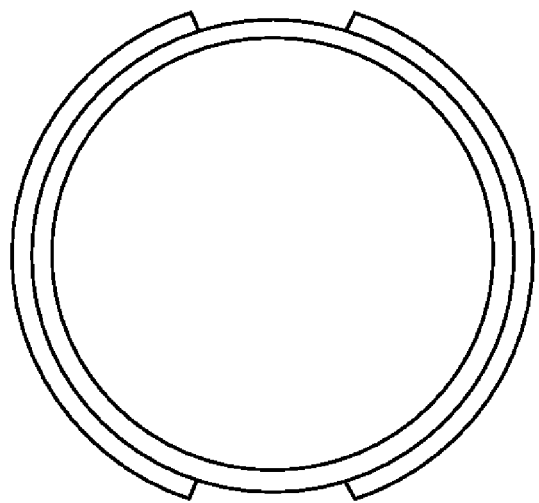
FIGS. 19A and B are schematic views showing the electrode arrangement to produce an axial electric field; a through diameter electric field; and a complex electric field.
Figure 19B:
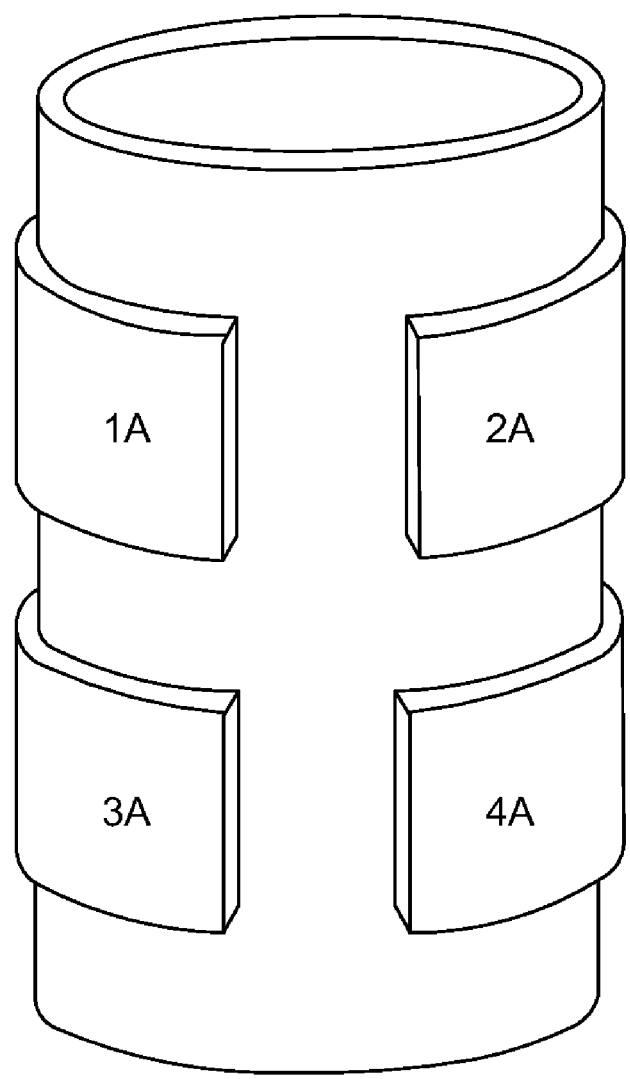

FIGS. 19A and B schematically show the arrangement and electrical connections of electrodes configured to produces axial, through diameter, and complex electric fields respectively. An axial electric field is produced when electrodes 1A and 2A are positive and electrodes 3A and 4A are negative. A through-diameter electric field is produced when electrodes 1A and 3A are positive and electrodes 2A and 4A are negative. A complex electric field is produced when electrodes 1A and 4A are positive and electrodes 2A and 3A are negative.

Figure 20:
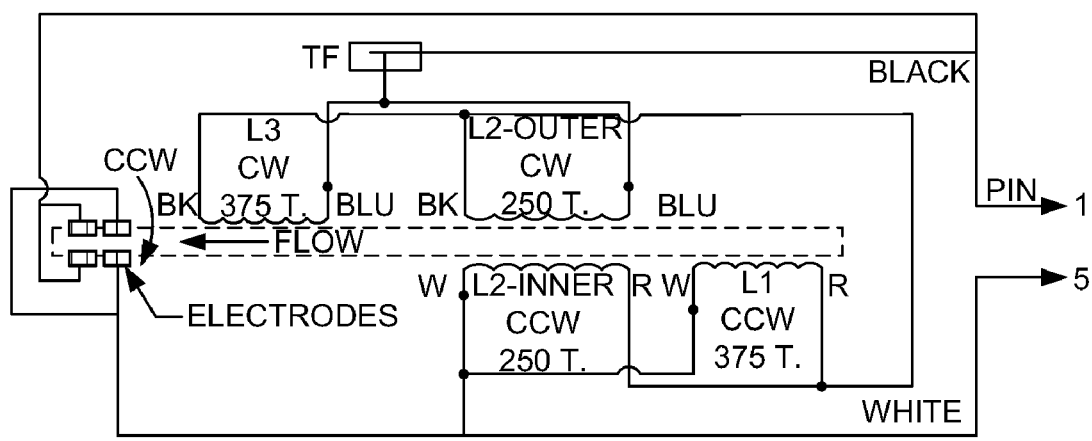
FIG. 20 is a schematic view of the coil arrangement, coil winding directions and coil terminal connections as disclosed in U.S. Pat. No. 6,063,267 as modified by the inclusion of electrodes powered by the coils and positioned to produce an axial electric field.

FIG. 20 shows in greater detail how the auxiliary electrodes may be connected to the existing device circuitry to produce an axial electric field. Similar connections may be made to the device circuitry to produce complex fields. Since more than one positive and one negative electrode are involved in the production of complex fields, all the positive electrodes can be connected in parallel and all the negative electrodes can be connected in parallel.

Electrode sizes are not considered critical to the success of their use. In general, electrodes can be roughly square in proportion and cover segments of the pipe ranging from less than about 90° to less than about 180° when multiple electrodes are circumferentially arranged or less than about 360° when single electrodes are arranged axially. Irrespective of the location of gaps over which a potential difference is applied, it is critical that at least one gap oriented axially exist. This gap prevents the circumferential flow of an electric current that can be induced in the electrode by the device's generated magnetic fields. Such a circumferential electric current can be expected to affect the performance of the device adversely by way of affecting other electric and magnetic fields.

Electrode thickness is also not critical to the success of the use of the electrodes. Material of thickness convenient for the manufacturing process may be used. Electrode material is also not critical as long as it is conductive. Electrodes such as copper are, however, considered to be highly desirable.

The electrodes can be located radially beneath the coils, or the electrodes can be located at an axially remote site. While it is envisioned that the electrodes are no more than a few inches from the coils, there is no absolute limit to that distance. Locating the electrodes at a remote site possesses advantages in the manufacturing process and in any repairs which can be required. Locating the electrodes beneath the coils provides some shielding against potential RF interference associated with the electrodes and protects personnel from the possibility of a minor electric shock during any potential repairs.

It has previously been demonstrated in this disclosure that both signal frequency and amplitude affect the electric field strength within the water in the pipe. At values typical of the device's operation, electrodes configured to provide a through diameter electric field produce a field strength similar to the maximum expected from other electric fields which can be generated by the device. The fields generated by the electrodes when so configured are, nevertheless, extremely significant because these fields affect a substantial portion (if not all) water flowing through the pipe, while other electric fields are limited to regions near the surface of the pipe. It has also previously been demonstrated that increases in frequency and amplitude of the signal can be expected to increase the strength of the through diameter electric field proportionately. There are, however, practical limits in the ability to increase either the frequency or the amplitude of the signal to the electrodes when using the methods represented in FIG. 20.

Figure 21:
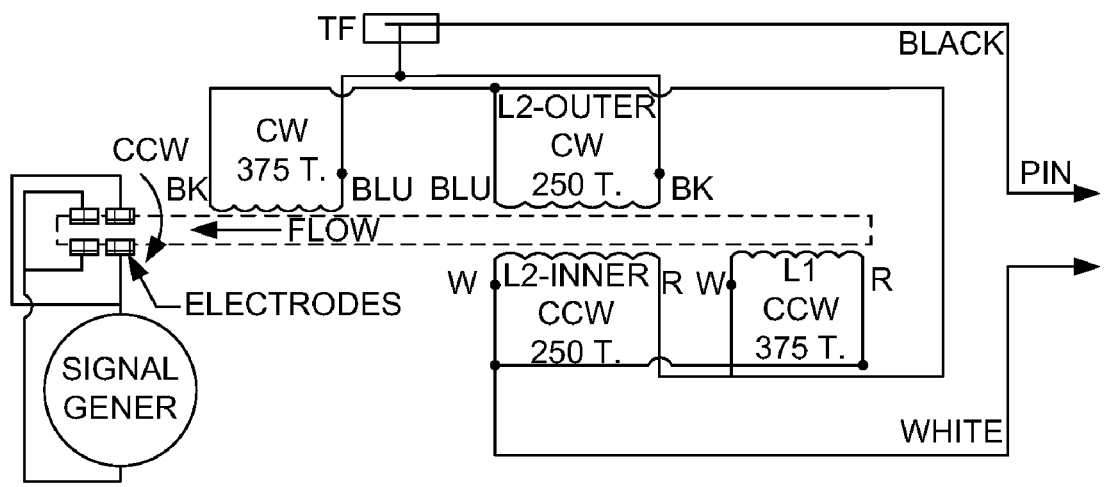
FIG. 21 is a schematic view of the coil arrangement, coil winding directions and coil terminal connections as disclosed in U.S. Pat. No. 6,063,267 as modified by the inclusion of electrodes powered by a signal generator and positioned to produce an axial electric field.
Figure 22:
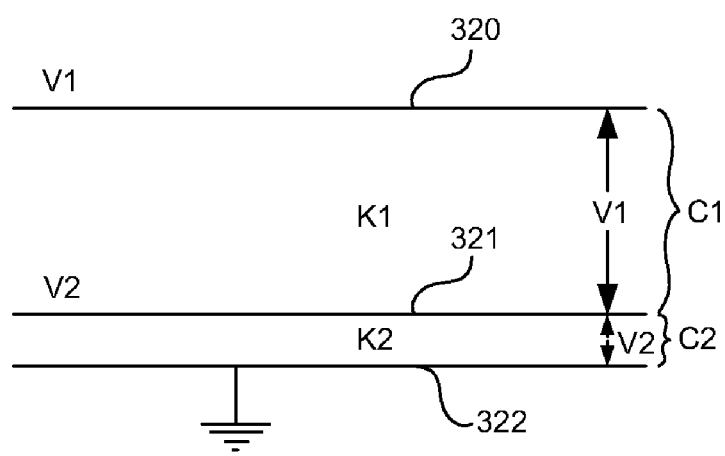
FIG. 22 is a schematic showing of a mixed-dielectric parallel plate capacitor.
Figure 23:
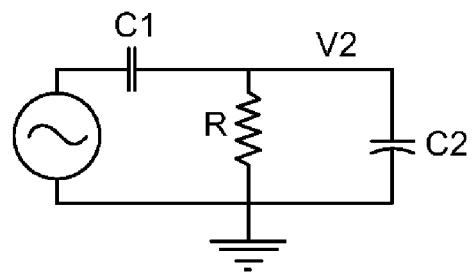
FIG. 23 is a diagram of a circuit with a lossy capacitor and an AC power source.

The fourth component, described as being useful with the invention, uses a separate signal generator to power the electrodes and, potentially, the coils. FIG. 21 shows in greater detail how the auxiliary electrodes may be connected to a separate signal generator to produce an axial electric field. This component represents a means to overcome the signal frequency and amplitude limitations associated with powering the electrodes using the signal generated by the ringing of the coil. Increasing both the signal amplitude and frequency by a factor of 10 or more is possible. The combination of these increases can increase the field strength by a factor of 100 or more. Increase in the field strength due to increasing the amplitude of the signal is expected to be highly beneficial to the effectiveness of the device in treating water. Increases in the field strength due to increasing the frequency of the signal can be beneficial as potential resonant frequencies of the microorganism cell membrane due to the capacitance of the membrane.

Figure 24:
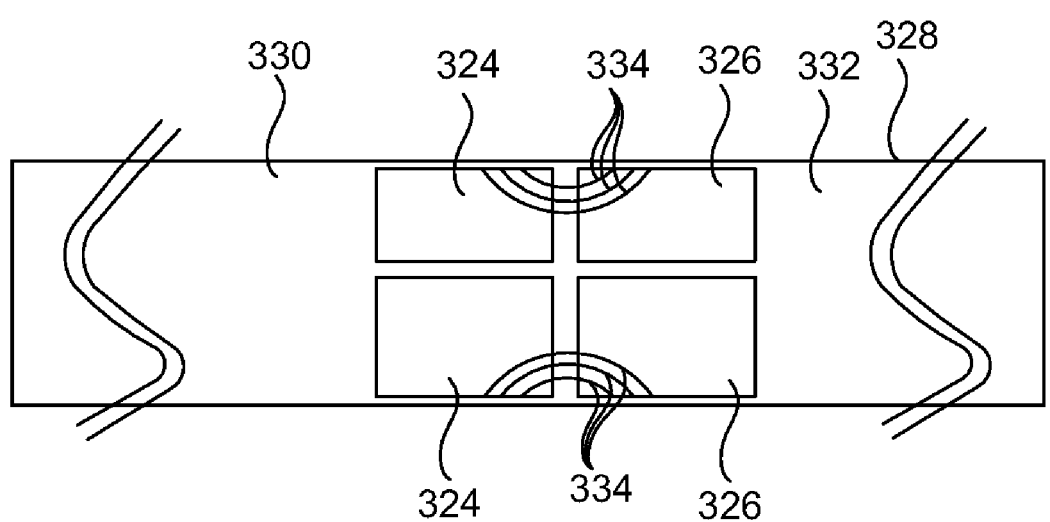
FIG. 24 is a side view of a pipe, according to one embodiment of the invention, and having two electrodes in the form of foils applied to its outer surface to create a charge-related electric field.

FIG. 24 illustrates a conduit or pipe having an electrode system for producing a simple charge-related electric field. This electric field is generated by applying two areal electrodes in the form of copper sheets or foils 324 and 326 to an outer annular surface region 327 of the pipe 328. Each foil contains a small air gap 330 and 332, respectively, to avoid disturbing the magnetic field by allowing current to circulate around the pipe. Each foil extends substantially around the full circumference of the pipe. The gap 330 or 332 in each foil prevents the foil from providing a continuous electrical conductor surrounding the pipe. These two electrodes 324 and 326 can be used in combination with the coil assembly (not shown). Preferably the electrodes are connected across the coil assembly so that the full peak-to-peak "ringing" voltage is applied between the electrodes. The coils of the coil assembly can be placed over the electrodes or axially outside of the electrodes. Alternatively, the electrodes can be used by themselves, independently of a conduit, in which case they are excited by their own driving circuit, providing a high-voltage high-frequency driving signal. In either event, the resulting charge-related electric field pattern produced by the excited electrodes is shown in FIG. 24 by the broken lines 334. It has a cylindrically symmetric shape, a section of which is shown. Components of the charge-related E field are nearly perpendicular to the pipe wall at the two electrodes, and the field curves around to become a Z-directed (axial) field near the central axis of the pipe.

Figure 25:
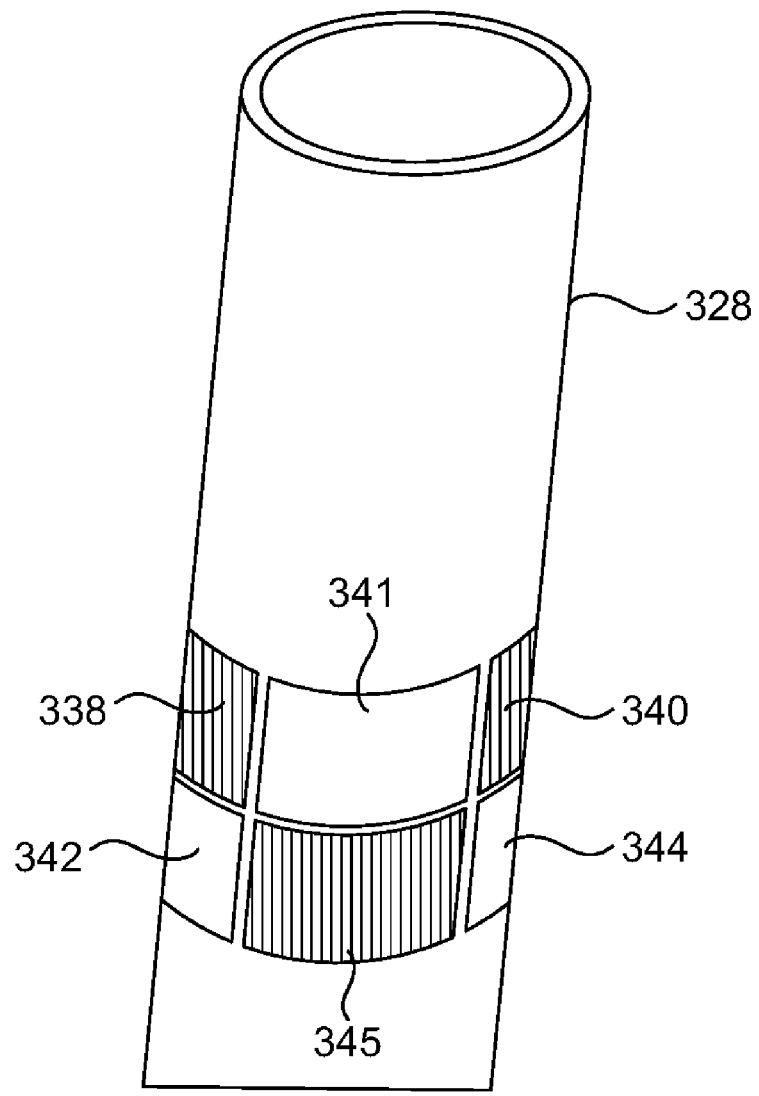
FIG. 25 is a perspective view of a pipe according to another embodiment of the invention and having eight foil electrodes applied to its outer surface to create multiple charge-related electric fields.
Figure 26:
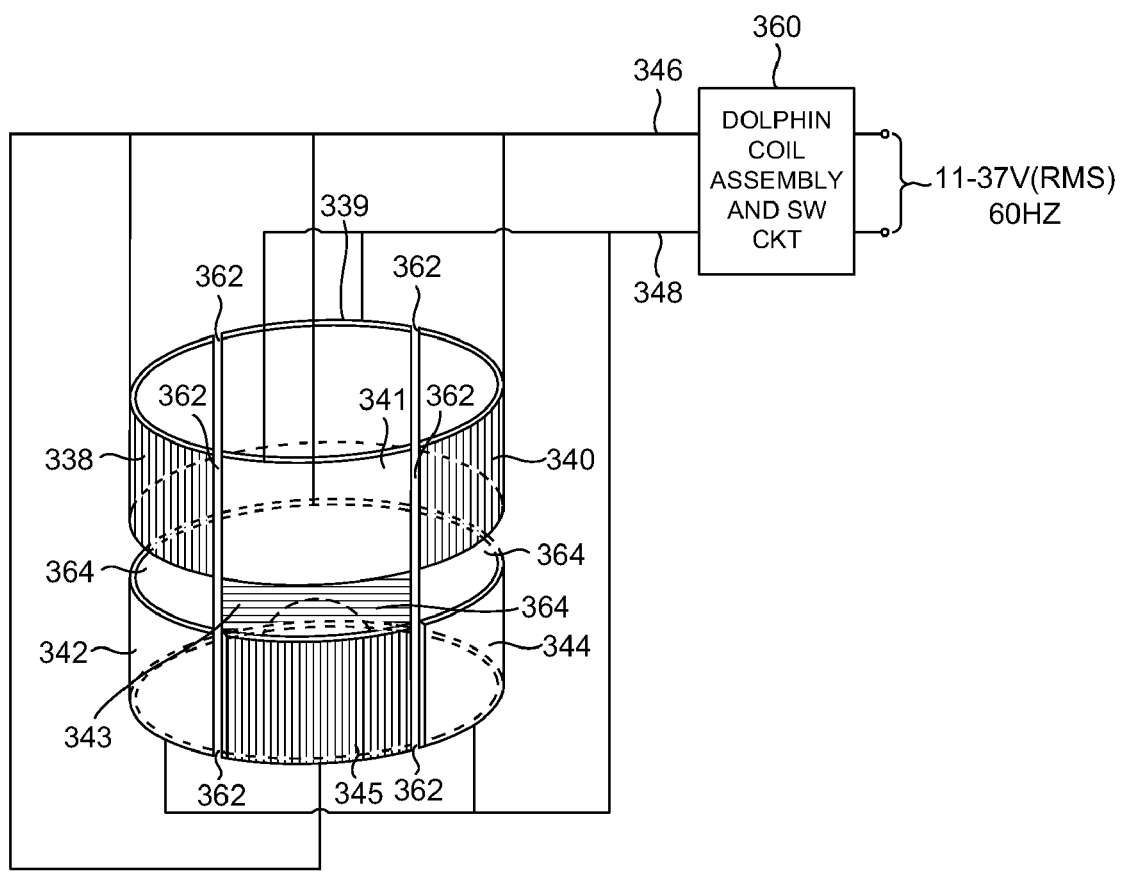
FIG. 26 is a schematic perspective view of the eight foil electrodes and showing the manner in which the electrodes are electrically connected with themselves and with a coil assembly.
Figure 27:
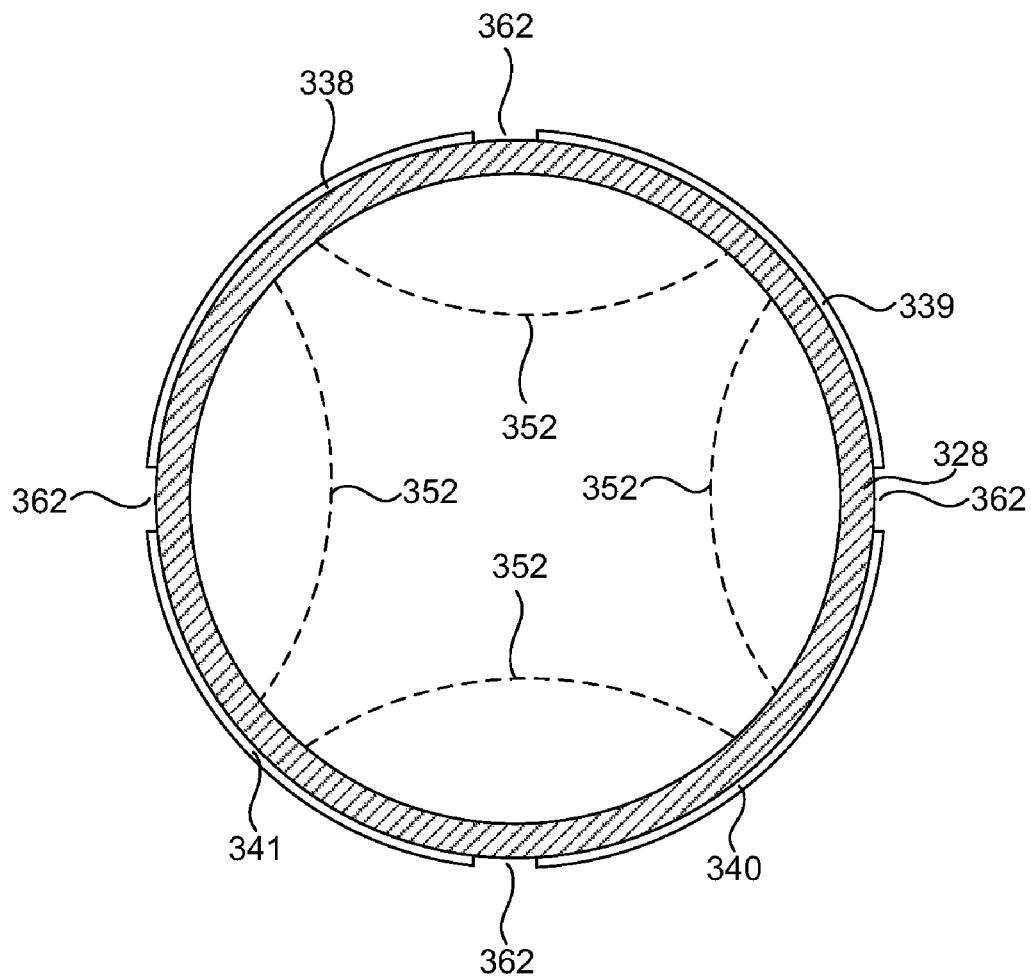
FIG. 27 is a transverse sectional view taken on the line VI-VI of FIG. 25.
Figure 28:
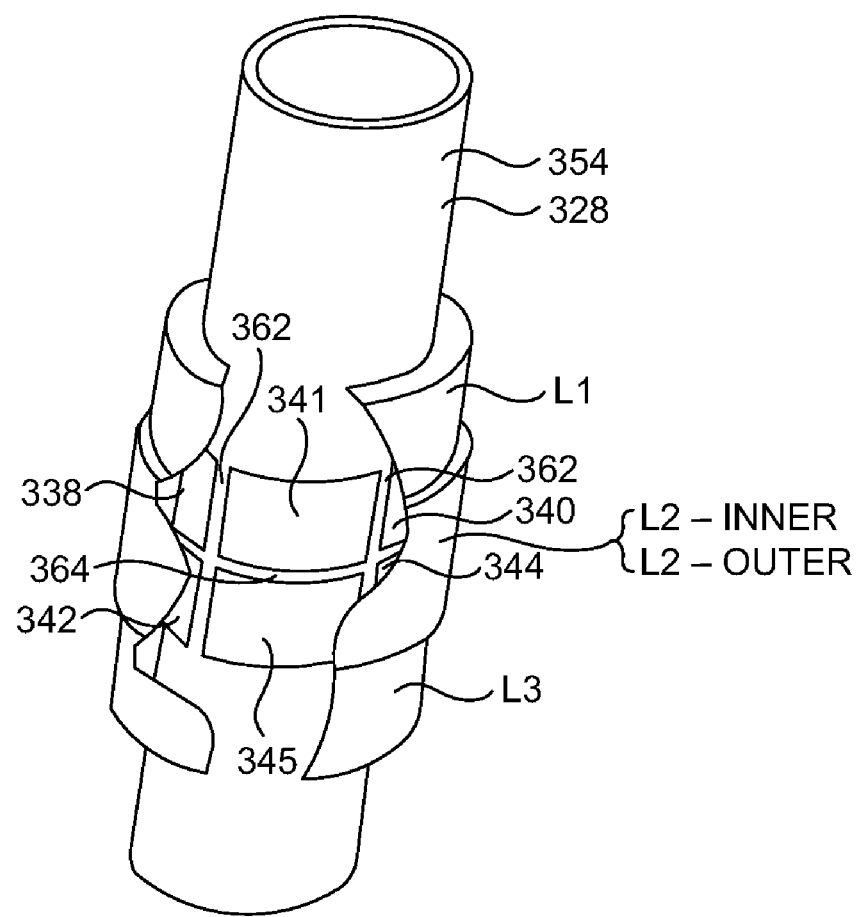
FIG. 28 is a partly schematic and partly broken away perspective view of the apparatus of FIG. 25.

FIGS. 25, 26, 27, and 28 illustrate a more complex electric field pattern which can be generated by arranging eight copper sheets or foils 338 to 345 as electrodes on two annular outer surface regions 328 of a pipe to form multiple capacitor sections. These arrangements are described below as being used in combination with coils, but they can also be used independently of such coils. In FIG. 25, only six of the eight electrodes are visible and are indicated at 338, 340, 341, 342, 344, and 345. In FIGS. 25, 26, and 27, as in FIG. 24, the coils are omitted for clarity. In FIG. 28, the coils are shown schematically and are indicated at $L_1$, $L_2$-inner, $L_2$-outer, and $L_3$ in keeping with the disclosure in U.S. Pat. No. 6,063,267. The coils can be placed over the areal electrodes, as shown in FIG. 28, partly over them or axially remote from them. Placing the coils over the electrodes, as in FIG. 28, shields the electrodes from human contact (a non-lethal electric shock can occur if the foils were touched) and provides good electromagnetic shielding so that the charge-related electric field does not radiate a signal to the surrounding environment.

With reference to FIGS. 25 through 28, the shaded electrodes 338, 340, 343, and 345 are connected in parallel with one another to one 346 of the coil assembly 360 drive leads, and the unshaded electrodes 339, 341, 342, and 344 are connected in parallel with one another and to the other coil assembly drive lead 348. The resulting charge-related E field is a combination of the field pattern shown in FIG. 24 and the field pattern shown in FIG. 27, where some of the field lines are indicated by the broken lines 352. The electrode arrangement of FIG. 28 produces both axially extending gaps 362 between some pairs of electrodes and circumferentially extending gaps 364 between other pairs of electrodes. The fields extending across the axially extending gaps 362 are patterned generally as shown in FIG. 327, and the fields extending across the circumferentially extending gaps are patterned generally as shown in FIG. 328.

A still more complex charge-related E fields can be generated by extending the above principles to more electrode pair sections. The advantage of using such higher-order fields is that such fields expose more of the flowing water to electric field forces.

FIG. 28 shows its electrode system to be "hidden" radially beneath and surrounded by a coil assembly. As seen in this figure, the pipe 328 carries the eight electrodes of FIGS. 25, 26, and 27 on its outer surface 328. These eight electrodes are in turn surrounded by the coils of the assembly, namely, the two single coils $L_1$ and $L_3$ at opposite ends of the coil assembly and the double coil $L_2$-inner/$L_2$-outer located between the two single coils $L_1$ and $L_3$, with the double coil being made of a radially inner single coil $L_2$-inner and a radially outer single coil $L_2$-outer located on top of and surrounding the coil $L_2$-inner. Advantageously, the coils and electrodes of the device can be arranged so that the circumferential gap or gaps 364 are axially aligned with an axial gap between two axially adjacent coils, with those two coils preferably being bucking coils.

The charge-related E field generating means described above are easy to power. These generating means have relatively small capacitances, which are on the order of 1000 picoFarads (pF) or less, for assemblies up to 16-inches. The current drawn by 1000 pF at 300 volts peak-to-peak and 30 kHz is only 0.03 amperes, which is negligible in comparison to the coil currents, which range from a few amperes up to the 40 ampere level. Even if a separate voltage source is used, in order to drive the electrodes at higher frequencies like 300 kHz, the current involved does not exceed an ampere. Therefore, the addition of greatly enhanced charge-related electric fields does not involve high costs or high power levels.

In addition to, or in place of, the charge-related fields described above and achieved by the use of one or more pairs of charge carrying bodies in the form of foil or plate electrodes, one or more charge-related fields can also be produced by a specific and controlled design of the placement of the coils. The coil placement is relative to one another and of their terminal locations, winding directions, and terminal polarities.

Figure 29:
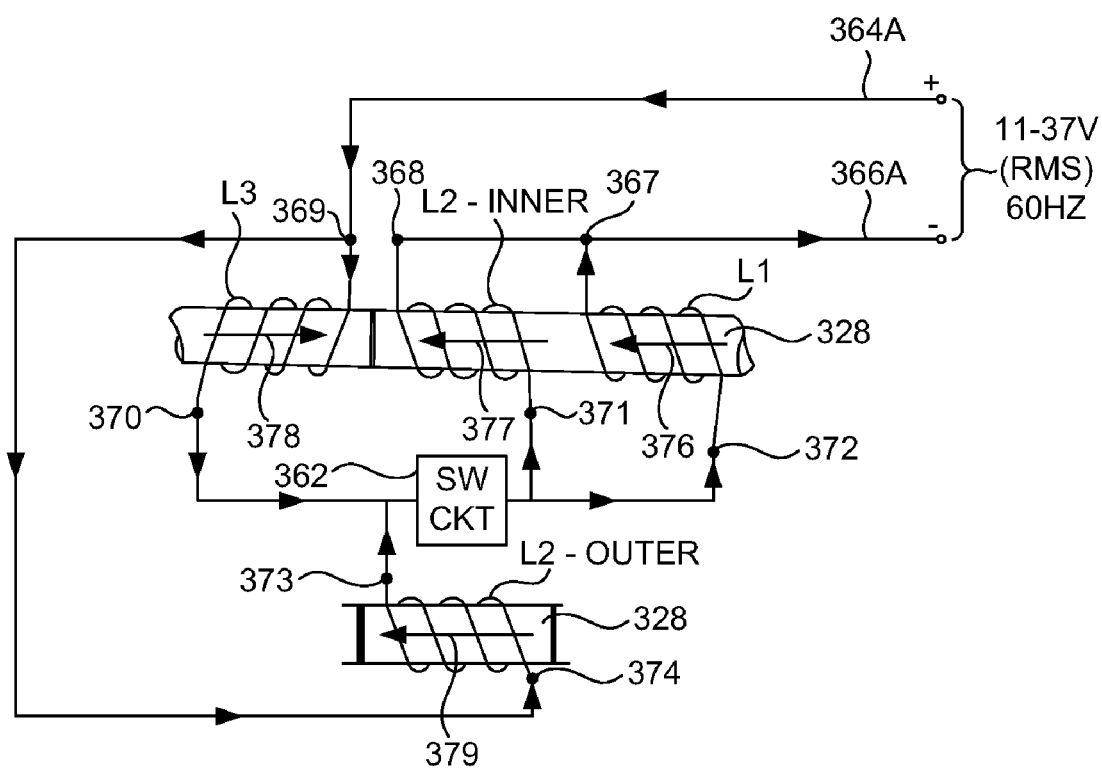
FIG. 29 is a schematic view showing the coil arrangement, coil winding directions, and coil terminal connections of an apparatus according to another embodiment of the invention.

FIG. 29 illustrates the coil $L_2$-outer separately from the coil $L_2$-inner, whereas in an actual embodiment it is wound on top of and surrounding the coil $L_2$-inner. The switching unit of the device is indicated at 362, and in keeping with U.S. Pat. No. 6,037,267, the coils are taken to be supplied with electrical power applied to the coil driving lines 364 and 366 at a voltage of 11 to 37 volts (vms) and a frequency of 60 Hz. The switching circuit 362 repeatedly makes and breaks an electric conducting circuit through itself at a 60 Hz repetition rate, dictated by the 60 Hz frequency of the coil driving power, to generate the desired high voltage and high frequency bursts of ringing currents in the coils. At the moment shown in FIG. 29, the line 364A is taken to have a positive voltage, as indicated by the + (plus) sign, and the line 366A is taken to have a voltage lower than that of the line 364A, as indicated by the − (minus) sign.

Each coil of FIG. 29 has two terminals with all eight of the terminals being indicated individually at 367 to 374. Between the two terminals of each coil, the conductor or wire of the coil is wound in a number of convolutions around the pipe. The number of convolutions in each coil can vary depending on the wire gauge and other factors, and is customarily in the range of 50 to 100 convolutions per coil. In FIG. 29, however, only a few convolutions are indicated for each coil to show more clearly the winding direction of each coil. At the moment shown in FIG. 29, the directions of the magnetic flux passing through the four coils are shown by the arrows 376, 377, 378, and 379.

FIG. 29 illustrates a charge-related electric field between the opposed ends of the coils $L_3$ and $L_2$-inner, that is between the right-hand end portion of the coil $L_3$ and the left-hand end portion of the coil $L_2$-inner. The field coil $L_3$ is designed such that its terminal 369 is located at the right-hand end of the coil $L_3$ and at the radially inner extremity of the coil $L_3$, and the coil $L_2$-inner is designed such that its terminal 368 is located at the left-hand end of that coil and at the radially inner extremity of that coil. Then the electrical connection of the coils with themselves and with the driving lines 364 and 366 are such that during operation of the device, a cyclically varying voltage difference appears across the two terminals 364 and 366. These terminals are of differing polarity. Therefore, with this design, the initial convolution or convolutions of the coils $L_3$ and $L_2$-inner respectively connected immediately to the terminals 369 and 368 become opposite charge carrying bodies (or electrodes) creating a charge-related electric field across the axial gap between the opposed ends of the coils $L_3$ and $L_2$-inner.

The four coils are energized so that the magnetic fluxes 376, 377, and 379 appearing in the coils $L_1$, $L_2$-inner and $L_2$-outer are all in the same axial direction, and so that the flux 378 in the coil $L_3$ is in the opposite direction so that the fluxes 377 and 378 oppose one another and are bucking in the region between the opposed ends of the coils $L_3$ and $L_2$-inner. This bucking of the magnetic fields produces in this region the strongest induced electric fields, and therefore the generation of the charge-related electric field in this same region is of especial benefit in the treatment of the fluid.

Figure 30:
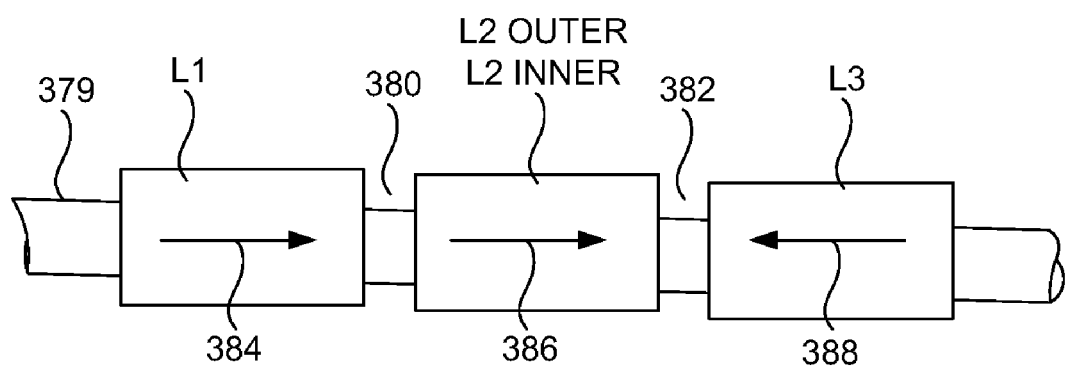
FIG. 30 is a view showing the placement of coils on a pipe.

FIG. 30 illustrates the fields produced in the region of a gap between two axially adjacent bucking coils. These fields are significantly stronger than they would be if the coils were non-bucking. The device consists of an interconnected set of four multi-layer solenoidal coils on a pipe 379. These coils are arranged in three sections labeled as $L_1$, $L_2$-outer/$L_2$-inner (one coil wound on the central pipe with another coil wound on top of it) and $L_3$, as shown in FIG. 30. Each of these coil sections is separated from its neighbor by a small axial gap 380 or 382, and the three coil sets are mounted along the central pipe 379 of the device. The current flow is such that the axial or Z-directed magnetic field vectors generated by $L_1$ and $L_2$ (inner and outer) point in the same direction shown by the arrows 384 and 386, and the axial magnetic field vector generated by $L_3$ points in the opposite direction shown by the arrow 388.

The gap 382 is therefore one produced by bucking coils, namely, the two coils $L_2$-inner and $L_2$-outer on the left and the coil $L_3$ on the right. The fields produced by these coils in the vicinity of the gap have also been discovered to vary in strength and other characteristics with changes in the axial width of the gap. Therefore, in the design of any fluid treatment device using bucking coils, it is important that the width of the gap be tuned or set to a value corresponding to maximum or near maximum fluid treatment effectiveness.

Figure 31:
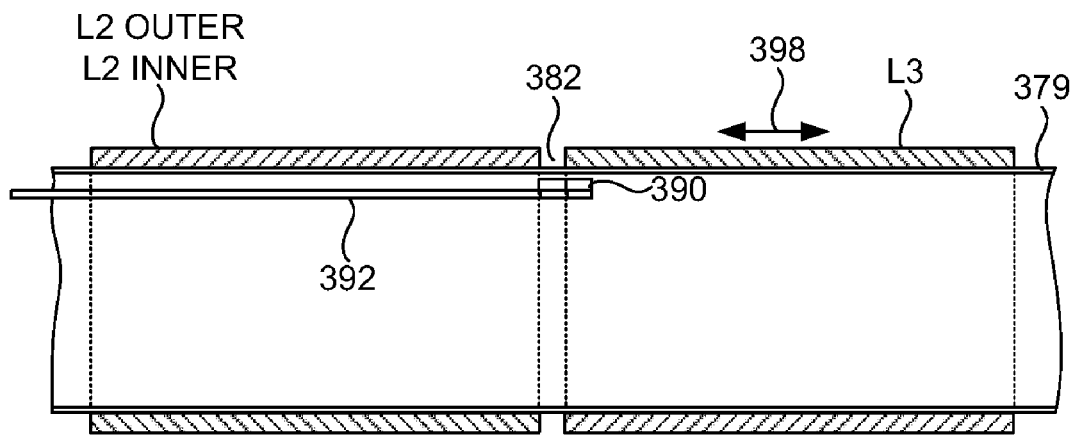
FIG. 31 is a longitudinal sectional view through the pipe of FIG. 30 showing a method for tuning the gap width between two axially adjacent coils.
Figure 32:
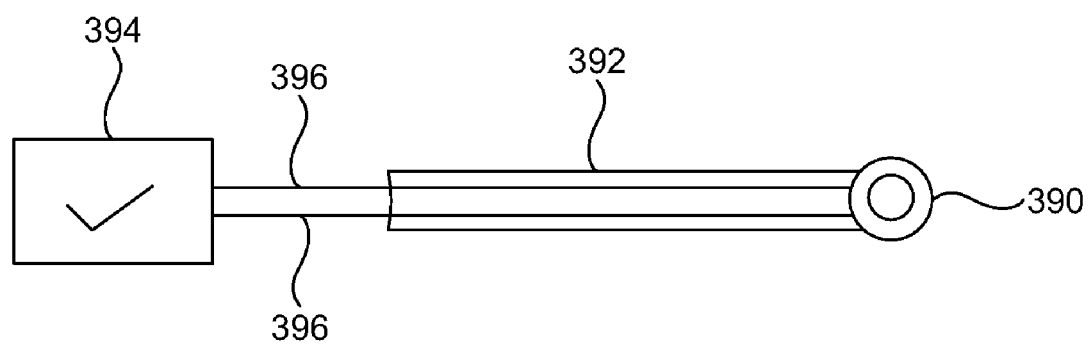
FIG. 32 is a top view of the sensing coil.

This setting of a desirable gap width can be determined for each particular size and design of a device. The strength of the magnetic field versus gap width in the vicinity of the bucking coil gap 382 can be measured by a small sensing coil 390 supported on a stick 392 inserted into the pipe 379 while the coils are excited. The voltage induced in the coil is measured by a volt meter 394 connected to the coil by conductors 396. In making these measurements, the coil 390 is positioned close to the inner wall of the pipe with its coil axis perpendicular to the wall surface, and at least one coil can be moved axially relative to the other, as shown by the arrow 398 for the coil $L_3$ in FIG. 31. The width of the gap producing the maximum voltage as served by the volt meter is then taken as the desirable width for the size and design of the device.

The invention can include a method for generating a ringing magnetic pulse for the treatment of fluids. An inductive coil and a silicon controlled rectifier (SCR) coupled in series with the coil are provided to form a first electrical loop. An electronically controlled switch, such as a MOSFET, is coupled in series with the coil to form a second electrical loop. The switch is preferably electrically connected generally in parallel with the SCR. An AC voltage signal is applied to the coil. The AC voltage signal has a period including a first half-cycle and a second half-cycle of opposite polarity to that of the first half-cycle. Current is conducted through the first loop during at least a portion of the first half-cycle when the SCR is forward biased while preventing current from being conducted through the second loop. Current is conducted through the second loop during a first portion of the second half-cycle while current is prevented from being conducted through the first loop when the SCR is reverse biased. Current is prevented from flowing through the second loop during a second portion of the second half-cycle upon the current flowing through the coil reaching a predetermined value to interrupt current flowing through the coil and to thereby generate a ringing magnetic pulse.

The invention can also include a system or means for generating a ringing magnetic pulse. The system includes an inductive coil to be powered by an AC voltage signal having a period including a first half-cycle and a second half-cycle of opposite polarity to that of the first half-cycle. A silicon controlled rectifier (SCR) is coupled in series with the coil to form a first electrical loop. An electronically controlled switch is coupled in series with the coil to form a second electrical loop. The switch is electrically connected generally in parallel with the SCR. The system further includes means for conducting current through the first loop during at least a portion of the first half-cycle when the SCR is forward biased while preventing current from being conducted through the second loop. Means are provided for conducting current through the second loop during a first portion of the second half-cycle while current is prevented from being conducted through the first loop when the SCR is reverse biased. The system further includes means for preventing current from flowing through the second loop during a second portion of the second half-cycle upon the current flowing through the coil reaching a predetermined value to interrupt current flowing through the coil and thereby to generate a ringing magnetic pulse.

The invention can also include a method for operating and constructing the system. These details are apparent from the following description of the invention having these embodiments.

The invention also includes improvements in devices and in related methods for treating fluids with magnetic and/or electric fields. At least some of these improvements can be incorporated into or used with known devices or used independently. Certain of these improvements are related to gaps or longitudinal (axial) spaces between induction coils, to the use of electrodes for creating electric fields, and/or to methods by which high frequency signals are generated.

The gap-related improvements related to the invention also include controlling the width (axial length) of a gap to obtain maximum fluid treatment effect in the vicinity of that gap. In the assembly of two axially adjacent coils on the pipe, the two coils are fixed to the pipe at positions which yield a precise optimum gap width known to produce maximum or near maximum fluid treating effect. A particular pair of coils and a driving power for the coils can vary the treating effectiveness of the fields in the vicinity of the gap. As the width of the gap is increased from zero, the effectiveness first increases to a maximum value and then decreases with the curve of effectiveness versus gap width being sharply peaked in the region of maximum effectiveness. To achieve this control of the gap width, it is required that for a given set of device construction details and operating conditions the preferred gap width for a given pair of coils in that construction first be determined. Then in making further devices, which have the same operating conditions, the pair of coils is then tuned or set to the determined, preferred gap width. Since the treating effectiveness of the fields in the vicinity of a coil gap is strongly dependent on the strength of those fields, the preferred gap width can be determined by measuring the field strength of the magnetic fields at the gap as the gap width is varied in a prototype apparatus permitting such gap width adjustment. An alternative method for tuning gap width can be performed by measuring the treatment effectiveness of a given device under given operating conditions. This procedure involves repeatedly running one or more devices of the given construction under the operating conditions with the particular pair of coils set at differing widths during the individual runs. The preferred gap width is the one yielding the maximum measured treatment effect. Still further, both of these methods for determining an optimum gap width can be used together. For example, the field strength versus gap width at the gap is first measured to obtain a rough estimate of the preferred gap width value and then measure treatment effectiveness versus gap width to obtain a more precise evaluation of the preferred gap width. This control of the gap width is of particular advantage in the case of a gap existing between two bucking coils and can also be of advantage in the case of a gap existing between two non-bucking coils. The preferred coil gaps for different sizes and constructions of devices can be determined through the use of a computer and software to display the magnetic fields produced by the coils of a device as changes in its coil size, coil placement, and other parameters occur.

The invention can use electrodes in which two coils with an intervening axial gap are wired so that a potential difference exists between adjacent end faces of the coils with the adjacent coil faces acting as electrodes of differing potential. Electrodes which are separate from the coils, however, offer several significant advantages when compared with electrodes formed by adjacent surfaces of the coils. Separate electrodes can be used in addition to coils for additional effect or can be used by themselves away from the presence of coils. Separate electrodes can be oriented to produce a wide variety of field directions. Also, separate electrodes can be configured so that electric fields of relatively high strength and better path shape penetrate through all or a significant portion of the entire diameter of the water pipe. This condition is contrasted to other electric fields that have significant strength only near the surface of the pipe. This condition provides the advantage that a greater volume of fluid or water is treated with each pass through the pipe.

The embodiment of through-pipe diameter penetration by significant electric fields can be readily demonstrated. The relatively large ratio of pipe diameter to electrode and pipe thickness permits the electrode, pipe, water system to be represented mathematically as a parallel plate capacitor containing two types of dielectric material, i.e., PVC pipe and water. The electric field strength at all points in the water can be expressed as Equation 3.

$$E_w = V_a \left[ \frac{\varepsilon_0 \rho \kappa_p \omega}{\sqrt{\varepsilon_0^2 \rho^2 \omega^2 (D_w \kappa_p + D_p \kappa_w)^2 + D_p^2}} \right] \quad (3)$$

where
$E_w$ is the electric field strength in the water (V/m)
$V_a$ is the voltage amplitude (½ the peak to peak) (V)
$D_p$ is the thickness of plastic in the capacitor (m)
$D_w$ is the thickness of water in the capacitor (m)
$\omega$ is $2\pi$ times the ringing frequency of the coil (sec$^{-1}$)
$\varepsilon_0$ is the permittivity of free space $8.854 \times 10^{-12 (F/m)}$
$\kappa_p$ is the dielectric constant of PVC pipe
$\kappa_w$ is the dielectric constant of water
$\rho$ is the conductivity of the water in the pipe ($\Omega$m)
Using values typical for an eight-inch device:
$V_a$=150 V
$D_p$=0.0127 m
$D_w$=0.2 m
$\omega$=188,500 sec$^{-1}$
$\varepsilon_0$=$8.854 \times 10^{-12 (F/m)}$
$\kappa_p$=2.5

It can be shown that the electric field strength throughout the fluid phase is 4.9 V/m which compares very favorably with the maximum E field value shown in Table 1 (which is limited to the surface of the pipe) of 7.0 V/m.

Theory of Charge-related Electric Field Generation

The following theory is proffered as the inventors' current understanding. However, the invention is not limited by the following theory.

The subject Z-axis E field is a "charge-related" field, as opposed to the "dB/dt" or "induced" electric field which is generated by time-varying currents. When charges are the source of an electric field, a charged capacitor is a model. The E field lines start on a charge and end on a charge of the opposite polarity. With the dB/dt field, there is no net static charge involved so the E field lines close on themselves in circles and do not begin or end on charges.

The voltage between the plates of a simple parallel-plate capacitor is V, the spacing is d, and the E field magnitude is V/d. If the area of each plate is A, the capacitance C is defined as Equation 4.

$$C = \frac{\varepsilon A}{d} \text{ (Farads, in mks units)} \quad (4)$$

The constant $\varepsilon$ is called the permittivity of the dielectric (insulating) medium and is chosen to make the unit values of charge, voltage, capacitance, length, etc., agree with each other in the mks system of units.

If the dielectric is made of two layers of insulating material, with each layer having a different "dielectric constant" k, the dielectric constant is defined by Equation 5 below, $$\varepsilon = k\varepsilon_0 \quad (5)$$

Here, $\varepsilon$ is the permittivity of the insulating medium and $\varepsilon_0$ is the permittivity of vacuum (in mks units, $8.854 \times 10^{-12}$ Farads/meter). Air has a k value very nearly unity, while most plastics and oils have k between 2 and 3. A simple example of a "mixed-dielectric" system is the parallel-plate capacitor sketched in FIG. 1, which is made of three identically shaped and sized flat parallel plates 10, 11, and 12.

If the plate area is assumed to be one, then the capacitances of the upper and lower capacitors $C_1$ and $C_2$ are established by Equation 6.

$$C_1 = \frac{\varepsilon_0 k_1}{D_1} \quad (6)$$

If voltage $V_1$ is applied to the upper plate 20 (the lowest plate 22 is taken as zero voltage, or "ground" for this example), then the voltage $V_2$ that appears on the intermediate plate 21 is given by Equation 7.

$$V_2 = V_1 \left( \frac{D_2 k_1}{D_2 k_1 + D_1 k_2} \right) \quad (7)$$

The electric field strength E (intensity) in each section of the capacitor is defined by the voltage applied across that section divided by the plate spacing (D) of the section. The resulting field strengths are shown in Equations 8 and 9.

$$E_1 = V_1 \left[ \frac{k_2}{D_2 k_1 + D_1 k_2} \right] = \frac{V_2 - V_1}{D_1} \quad (8)$$

and $$E_2 = V_1 \left[ \frac{k_1}{D_2 k_1 + D_1 k_2} \right] = \frac{V_2}{D_2} \quad (9)$$

The ratio of these field strengths is simply as shown in Equation 10.

$$\frac{E_1}{E_2} = \frac{k_1}{k_2} \quad (10)$$

An approximate analysis of the electric fields of a device can be made if conducting plates are applied to the outer surface of the insulating pipe. The effect of an imperfectly insulating (lossy) dielectric medium, like water, must be modeled. Water contains mobile ions that allow it to conduct electricity. A first-order model of a water dielectric (k=80) is a capacitor in parallel with a resistor. The equivalent circuit for a device with an almost perfect insulating plastic pipe surrounding conductive water is then as shown in FIG. 2.

Figure 2:
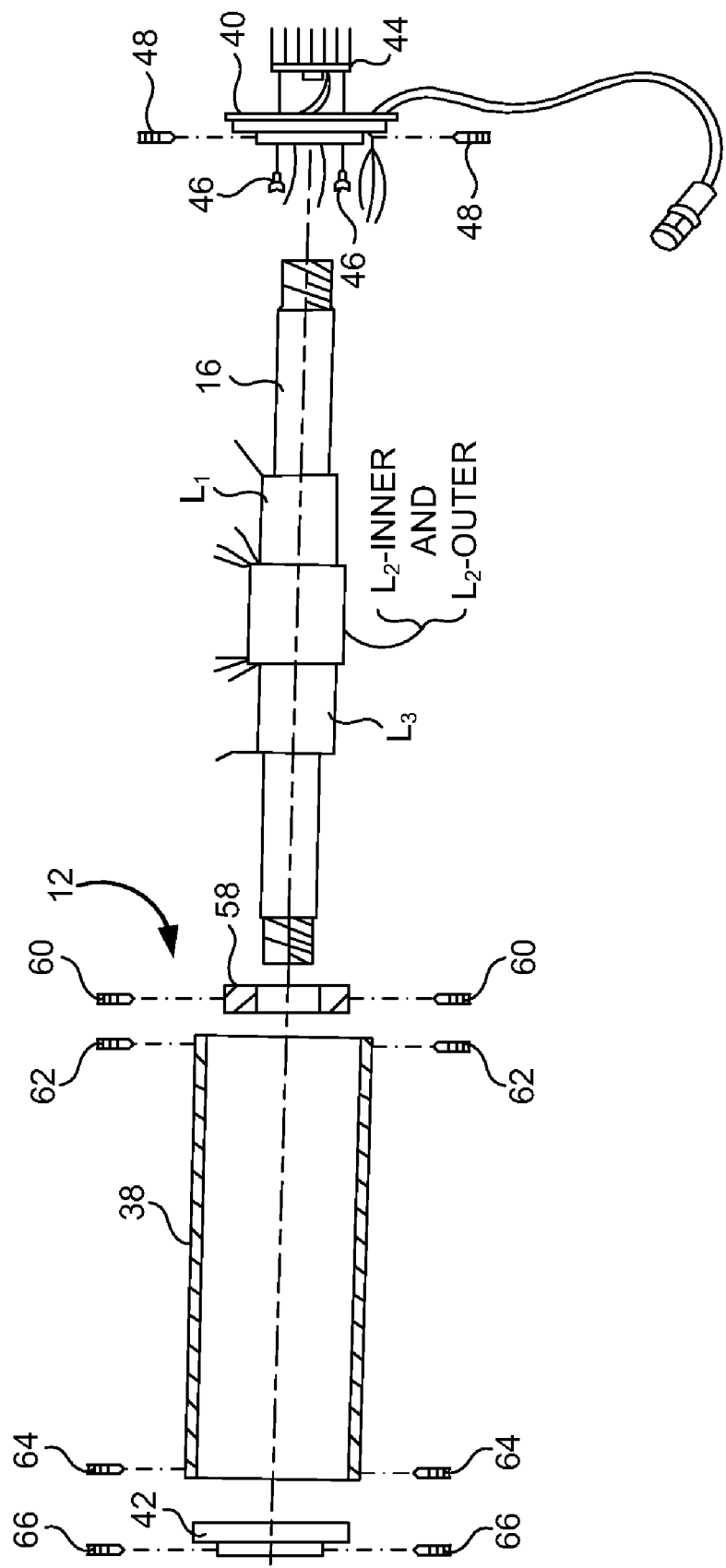
FIG. 2 is an exploded view of a pipe unit of the apparatus of FIG. 1.
Figure 3:
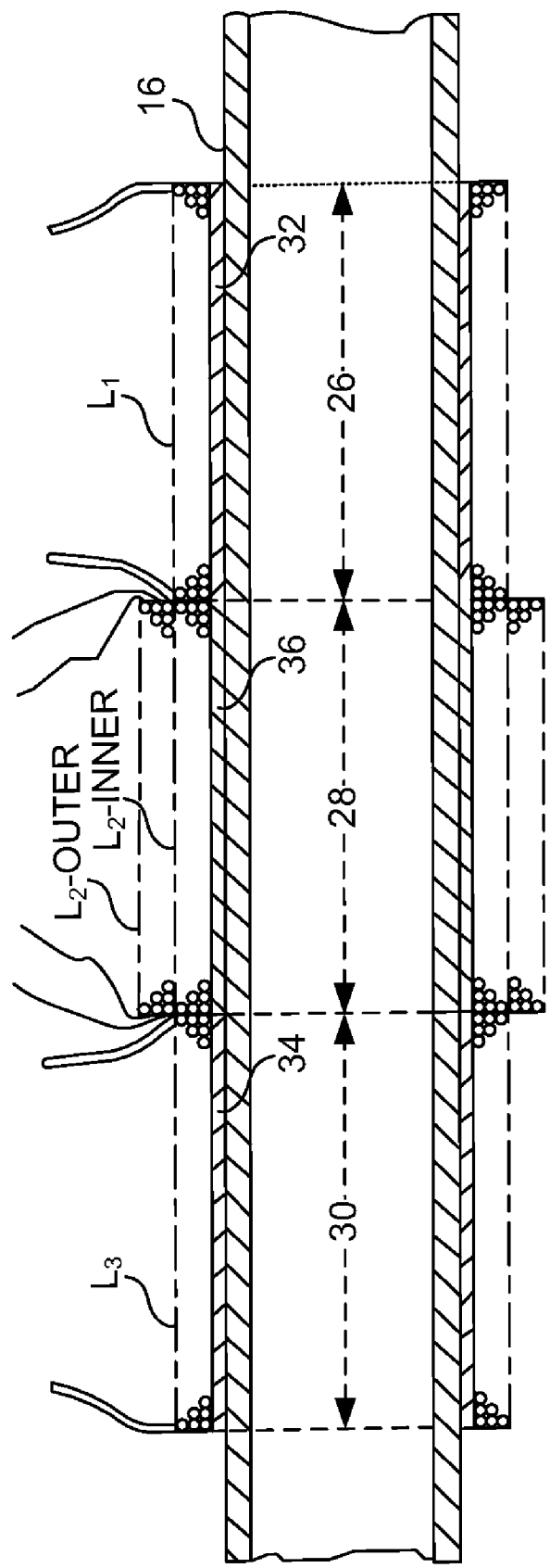
FIG. 3 is a longitudinal cross sectional view taken through the pipe unit of FIG. 1.

In FIG. 2, C1 represents the plastic pipe wall and C2 the water, with its parallel resistance. It is easy to show that the frequency response of this simple circuit is as follows in Equation 11.

$$V_2 = V_1 \left[ \frac{RC_1 s}{s(RC_1 + RC_2) + 1} \right] \quad (11)$$

Here, s is the LaPlace "frequency" variable, $s=j\omega$ and $\omega=2\pi f$ where f is the frequency in Hz of the sinusoidal voltage source $V_1$. By inspection, as f approaches zero (low frequency), $V_2$ also approaches zero. So a highly conductive water medium (low value of resistor R) "shields" the electric fields that are applied from outside the pipe if the frequency is low. However, as the frequency approaches large values, FIG. 1 demonstrates the results. The resistance is divided from the equation if the denominator is much larger than one as follows in Equation 12.

$$V_2 = V_1 \left[ \frac{C_1}{C_1 + C_2} \right] = V_1 \left[ \frac{D_2 k_1}{D_2 k_1 + D_1 k_2} \right] \quad (12)$$

This result is the same as obtained from Equation 7) for the mixed-dielectric system of FIG. 1, where loss was not considered. The usefulness of this result is the concept of "frequency cutoff." Above some frequency, the electric field penetrates the water easily and below that frequency, the electric field begins to drop as frequency is reduced. This "cutoff" or "crossover" frequency is as follows in Equation 13.

$$f = \frac{1}{2\pi R(C_1 + C_2)} \approx \frac{1}{2\pi R C_2} \quad (13)$$

Because the capacitance of $C_2$ (the water-dielectric capacitor) is usually larger than $C_1$, the approximate result can often be used. Above this cutoff frequency of Equation 13, the first term in the denominator of Equation 11 is larger than one, and so dominates the result.

For a conductive medium like water, one speaks of its "conductivity" and typically measures this number with a conductivity meter. The mks units of conductivity are called "Siemens." The reciprocal of conductivity is resistivity and its mks units are Ohm-meters. A resistivity value of one million ohm-cm is typical of highly purified water, and a value of 10,000 ohm-cm (100 times lower than purified water) is typical of "tap water." If the resistivity is multiplied by the capacitance, the dimensions of the capacitor divide out and produce the following as shown in Euqation 14:

$$RC = \epsilon_0 k \rho \quad (14)$$

Here, $\epsilon_0 = 8.854 \cdot 10^{-12}$ Farads/meter and $\rho$=resistivity in ohm-meters.

The dielectric constant (k) is 80 for water. So "tap water," which has a resistivity of about 10,000 ohm-cm, or 100 ohm-meters, has an RC value of about 70 nanoseconds. The "crossover frequency 'f'" from Equation 11 is then 2.2 MegaHertz (2.2 MHz). This frequency is much higher than the typical device generates (30 kHz), so significant attenuation of the electric field can be expected if the electric field generator operates at a normal frequency. The attenuation factor is approximately equal to the ratio of operating frequency to "crossover frequency" or in the present case about 0.01. The electric field in "tap water" is about one percent of the fields to be achieved in highly purified water, which has a "crossover frequency" of about 23 kHz if the resistivity is one megohm-cm. Field estimates can be made by combining Equations 11 and 12 to define the "transfer function" for the E field (in the lossy dielectric) per applied volt.

$$E_2 = V_1 \left[ \frac{\varepsilon_0 \rho k_1 s}{\varepsilon_0 \rho s (D_2 k_1 + D_1 k_2) + D_1} \right] \quad (15)$$

This result is a complex number, since "s" is imaginary, so its magnitude is determined as follows.

$$E_2 = V_1 \left[ \frac{\varepsilon_0 \rho k_1 \omega}{\sqrt{\varepsilon_0^2 \rho^2 \omega^2 (D_2 k_1 + D_1 k_2)^2 + D_1^2}} \right] \quad (16)$$

Suppose a device is modified by applying metal plates to the outer pipe surface wherein the pipe diameter is eight inches and the pipe wall thickness is ¼ inch. If the water resistivity $\rho$ is 10 kilohm-cm=100 ohm-meters (tap water) and the peak applied voltage between the metal plates be 300 volts peak-to-peak (equal to the present device "ringing" voltage). The frequency is 30 kHz. The (approximate) charge-related E field present in the water due to the metal plates can then be calculated as follows:

$D_1$=spacing of plastic capacitor=0.5 inch (two wall thicknesses)=0.0127 m
$D_2$=spacing in water=8 inches=0.2 m
$\epsilon_0 = 8.854 \cdot 10^{-12}$ Farads/m
$k_1$=dielectric constant of pipe=2.5
$k_2$=dielectric constant of water=80
$\rho$=100 Ohm-meters
$V_1$=150 volts Then Equation 16 gives $E_2$ (in volts per meter)=4.9 V/m=0.049 V/cm=49 mV/cm.

This calculation provides the "best case" magnetically induced E field of 70 mV/cm. This calculation suggests that the use of metal plates is beneficial because the charge-related E field is comparable to the magnetically induced field. The volume over which the charge-related E field acts is much larger, so it more effectively exposes the water and its contaminates to the electric field If the water in the device is less conductive than the "tap water" example, the charge-related E field is larger. In the limit of very pure water, the charge-related E field in the above example approaches the value given by Equation 9, which is 2.5 V/cm. This value is 35 times larger than the magnetically-induced E field, a significant gain in performance.

Raising the frequency of the voltage source above 30 kHz produces a larger charge-related E field in the "tap water" example. If the metal plates are operated at 300 kHz, the charge-related E field rises to 48.5 V/m or 485 mV/cm, which is about seven times the "best case" magnetically-induced E field. This result is accomplished with simple drive circuits as discussed below. Also, raising the drive voltage above 300 volts peak-to-peak increases the charge-related E field in proportion. Using 1000V peak-to-peak at 300 kHz, a charge-related E field of 1630 mV/cm is provided, which is about 23 times the magnetically-induced field.

Placing the metal plates on the inside surface of the pipe greatly increases the electric field, as the "plastic capacitor" is then removed from the circuit. In the above example, a 300-volt peak-to-peak drive signal can produce 7500 mV/cm=7.5 V/cm E fields if the plates are in direct contact with the water. However, the plates are subject to corrosion and might eventually erode away, unless an inert metal, such as gold, is used.

The magnitude and frequency of the cyclically varying voltage are to be set at values sufficiently high to achieve the desired aim of producing a beneficial treating effect on the involved fluid, and the actual values of voltage and frequency chosen can vary widely. Factors such as safety, pipe size, rate of fluid flow, electrode number and size, electrode gap size and orientation, available power, etc., can vary these results. In general, it is believed that the cyclically varying voltage difference applied across two adjacent electrodes can have a peak-to-peak voltage greater than 200 volts and a frequency greater than 20 kHz. More preferably, the voltage difference has a peak-to-peak magnitude greater than 300 volts and a frequency greater than 30 kHz. Since the strength of the charge-related E field increases with increases in either one or both of the peak-to-peak voltage magnitude and frequency, a still more preferred practice is to operate with the peak-to-peak voltage magnitude being greater than 1000 volts and the frequency being greater than 300 kHz. It is important that the size of the gap between adjacent electrodes be relatively small or in the order of 0.5 inch or less for pipe diameters of six inches to 16 inches and in the order of less than 0.25 inch for pipe sizes of six inches or less.

This invention relates to methods and apparatus for treating fluids by way of magnetic and/or electric fields made to exist internally of the fluids to destroy, remove, or reduce undesirable agents, such as microorganisms, particles, or ions contained in the fluid, and/or to inhibit the formation of scale or other deposits on surfaces contacted by the fluid, especially those surfaces involved in heat transfer. As another effect of the conditions resulting from the treatment process, the corrosiveness of the treated fluid to materials of construction may be reduced. The invention has wide application to a variety of fluids, including both gases and liquids, with the treated fluid being either stationary or flowing along a confined path, such as provided by a pipe during its treatment. The invention also treats flowing liquids that are contained within a channel, such as piped water, used for domestic, residential, commercial or industrial purposes including cooling towers and circulation water in HVAC equipment.

As will be recognized by those of ordinary skill in the pertinent art, numerous modifications and substitutions may be made to the above-described embodiment of the present invention without departing from the scope of the invention. Accordingly, the preceding portion of this specification is to be taken in an illustrative, as opposed to a limiting, sense.

What is claimed is:

1. An apparatus for treating a fluid with electromagnetic fields, said apparatus comprises:
   (A) a treatment zone having a non-metallic conduit through which said fluid flows:
   (B) a power supply;
   (C) a signal generator having:
       (i) at least one switch;
       (ii) a first controller, said first controller operates said switch; and
       (iii) a first power source fed by said power supply for supplying power to said switch;
   (D) at least one high frequency induction coil, said high frequency induction coil surrounds a section of said conduit and provides a high frequency electromagnetic field into said treatment zone in sufficient strength and for a sufficient exposure time to treat contaminants in said fluid;
   (E) a second controller, said second controller includes two diodes, each of said diodes switches an alternate half of applied supply voltage;
   (F) a second power source fed by said power supply, said second power source includes a transformer; and
   (G) at least two low frequency induction coils, said low frequency induction coils surround a section of said conduit and provide a low frequency electromagnetic field in said treatment zone in sufficient strength and for sufficient exposure time to treat contaminants in said fluid.

2. The apparatus according to claim 1 wherein said power supply receives power at 50-60 Hz.

3. The apparatus according to claim 2 wherein said second power source provides a voltage of 11-37 volts.

4. The apparatus according to claim 3 wherein said high frequency induction coil generates an electromagnetic field with a frequency of 10-80 kHz.

5. The apparatus according to claim 4 wherein said low frequency induction coils are wound and powered so that the current flowing through each coil generates an axial magnetic field within said coil and the direction of each of said fields is opposing.

6. The apparatus according to claim 5 wherein said induction coil is coupled to at least one capacitor.

7. The apparatus according to claim 1 wherein said second power source provides a voltage of 11-37 volts.

8. The apparatus according to claim 1 wherein said high frequency induction coil generates an electromagnetic field with a frequency of 10-80 kHz.

9. The apparatus according to claim 1 wherein said low frequency induction coils are wound and powered so that the current flowing through each coil generates an axial magnetic field within said coil and the direction of each of said field is opposing.

10. The apparatus according to claim 1 wherein said induction coil is coupled to at least one capacitor.

* * * * *